US007355913B2

(12) United States Patent
Kang et al.

(10) Patent No.: US 7,355,913 B2
(45) Date of Patent: Apr. 8, 2008

(54) SEMICONDUCTOR MEMORY DEVICE

(75) Inventors: Hee-Bok Kang, Kyoungki-do (KR);
Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 149 days.

(21) Appl. No.: 11/396,193

(22) Filed: Mar. 30, 2006

(65) Prior Publication Data

US 2006/0233038 A1    Oct. 19, 2006

(30) Foreign Application Priority Data

Mar. 31, 2005    (KR) ...................... 10-2005-0027382

(51) Int. Cl.
*G11C 7/02* (2006.01)
(52) U.S. Cl. ...................... 365/207; 365/203
(58) Field of Classification Search ................ 365/207, 365/205, 203
See application file for complete search history.

(56) References Cited

U.S. PATENT DOCUMENTS

| | | | |
|---|---|---|---|
| 5,198,995 A | 3/1993 | Dennard et al. | |
| 5,235,550 A | 8/1993 | Zagar | |
| 5,367,488 A * | 11/1994 | An ........................ | 365/189.01 |
| 5,696,725 A | 12/1997 | Kim | |
| 5,761,123 A * | 6/1998 | Kim et al. ............. | 365/185.21 |
| 5,870,343 A * | 2/1999 | Chi et al. .................... | 365/203 |
| 6,078,538 A | 6/2000 | Ma et al. | |
| 6,097,652 A * | 8/2000 | Roh ........................... | 365/205 |
| 6,678,199 B1 | 1/2004 | Joo | |

FOREIGN PATENT DOCUMENTS

| | | |
|---|---|---|
| JP | 06-085200 | 3/1994 |
| JP | 10-214485 | 8/1998 |
| JP | 10-233092 | 9/1998 |
| JP | 10-340581 | 12/1998 |
| JP | 2003-217280 | 7/2003 |
| JP | 2005-51044 | 2/2005 |
| KR | 1997-0018497 | 4/1997 |
| KR | 1998-067036 | 10/1998 |
| KR | 10-2004-0065322 | 7/2004 |

* cited by examiner

*Primary Examiner*—Ahn Phung
(74) *Attorney, Agent, or Firm*—Blakely Sokoloff Taylor & Zafman

(57) ABSTRACT

A semiconductor memory device includes a first first-type well including a first cell array for storing a data to apply the data to one of a first bit line and a first bit line bar, and a first precharge MOS transistor having a second-type channel for equalizing voltage levels of the first bit line and the first bit line bar; a first second-type well including a first sense amplifying MOS transistor having a first-type channel for sensing and amplifying the signal difference between the first bit line and the first bit line bar, and a first connection MOS transistor; and a second first-type well including a second sense amplifying MOS transistor having a second-type channel for sensing and amplifying the signal difference between the first bit line and the first bit line bar.

30 Claims, 11 Drawing Sheets

SEMICONDUCTOR MEMORY DEVICE

FIELD OF THE INVENTION

The present invention relates to a semiconductor memory device; and, more particularly, to a semiconductor memory device for efficiently operating under a low power supply voltage condition.

DESCRIPTION OF RELATED ARTS

FIG. 1 is a block diagram showing a core area of a conventional semiconductor memory device.

As shown, the conventional semiconductor memory device includes a row address input unit 20, a column address input unit 30, a cell area 100 and a data input/output unit 40.

The row address input unit 20 receives a row address and decodes the row address to output the decoded row address to the cell area 100. The column address input unit 30 receives a column address and decodes the column address to output the decoded column address to the cell area 100. The data input/output unit 40 outputs data stored in the cell area 100 and delivers data inputted through a data pad/pin into the cell area 100.

The cell area 100 includes a plurality of cell arrays, e.g., 110, 120, 130 and 140 and a plurality of sense amplifying blocks, e.g., 150 and 160. Each of the plurality of cell arrays 110 to 140 includes a plurality of unit cells, each for storing data. Each of the bit line sense amplifying blocks 150 and 160 amplifies the data outputted from the plurality of cell arrays 110 to 140 to output the amplified data to the data input/output unit 40.

As described above, during a read operation, each of the bit line sense amplifying blocks 150 and 160 amplifies the data outputted from the plurality of cell arrays 110 to 140 to output the amplified data to the data input/output unit 40. Otherwise, during a write operation, each of the bit line sense amplifying blocks 150 and 160 latches the data outputted from the data input/output unit 40 to output the latched data to the plurality of cell arrays 110 to 140.

FIG. 2 is a block diagram depicting a detailed structure of the cell area 100 shown in FIG. 1.

As shown, in a first cell array 110, a plurality of unit cells, e.g., CELL1, CELL2 and CELL3, are provided with every intersection between a plurality of bit line pairs, e.g., BL and /BL, and a plurality of word lines, e.g., WL0 to WL5. Herein, each unit cell is constituted with a capacitor and a transistor.

For instance, a first cell CELL1 includes a first capacitor C0 and a first MOS transistor M0. The first capacitor C0 is coupled between the first MOS transistor M0 and a plate line PL. The first MOS transistor M0 is coupled between the first capacitor C0 and a bit line BL and has a gate coupled to a first word line WL0.

The first cell CELL1 and a second cell CELL2 respectively coupled to the first word line WL0 and a second word line WL1 and neighbored with each other are commonly connected to the bit line BL; and the bit line BL is coupled to a sense amplifier 152a included in the bit line sense amplifying block 150.

In case of reading data stored in the first cell CELL1, the first word line WL0 is selected and activated; then, as a result, the first MOS transistor M0 is turned on. The data stored in the first capacitor C0 is delivered into the bit line BL.

The sense amplifier 152a senses and amplifies the data by using a potential difference between the bit line BL receiving the data delivered through the first MOS transistor M0 and a bit line bar /BL receiving no data outputted from any cell included in the first cell array 110.

After sensing and amplifying operations by the sense amplifier 152a, the amplified data is outputted through a local data bus line pair LDB and LDBB to the external circuit.

At this time, the sense amplifier 152a senses and amplifies the data on the bit line bar /BL as well as the data on the bit line BL to thereby transfer the data pair to the external circuit through the local data bus line pair LDB and LDBB.

That is, if the first cell CELL1 stores data being a logic high level "1", i.e., the first capacitor C0 is charged, the bit line BL has a voltage level of a source voltage VDD and the bit line bar /BL has a voltage level of a ground voltage GND after the sensing and amplifying operations. Otherwise, if the first cell CELL1 stores data being a logic low level "0", i.e., the first capacitor C0 is discharged, the bit line BL has a voltage level of the ground voltage GND and the bit line bar /BL has a voltage level of the source voltage VDD after the sensing and amplifying operations.

Since an amount of charge stored in each capacitor of unit cells is a little, the charge should be restored in the capacitor of each original unit cell after the charge is delivered into the bit line BL. After completing the restoration by using the sensed data of the sense amplifier, a word line corresponding to the original unit cell is inactivated.

In case of reading data stored in a third cell CELL3, the third word line WL2 is selected and activated; then, as a result, the third MOS transistor M2 is turned on. The data stored in the third capacitor C2 is delivered into the bit line bar /BL. The sense amplifier 152a senses and amplifies the data by using the potential difference between the bit line bar /BL receiving the data delivered through the third MOS transistor M2 and the bit line BL receiving no data outputted from any cell included in the first cell array 110.

Further, in the write operation, i.e., when an inputted data is stored in the cell array, a word line corresponding to inputted row and column addresses is activated and, then, data stored in a cell coupled to the word line is sensed and amplified by the sense amplifier 152a. After then, the amplified data is substituted with the inputted data. That is, the inputted data is latched in the sense amplifier 152a. Next, the inputted data is stored in the unit cell corresponding to the activated word line. If it is completed to store the inputted data in the unit cell, the word line corresponding to the inputted row and column addresses is inactivated.

FIG. 3 is a block diagram describing a connection between each cell array and each sense amplifying block included in the cell area 100 shown in FIG. 1. Particularly, the conventional semiconductor memory device has a shared bit line sense amplifier structure. Herein, the shared bit line sense amplifier structure means that two neighbor cell arrays are coupled to one sense amplifying block.

As shown, there are a plurality of cell arrays 110, 130 and 180 and a plurality of sense amplifying blocks 150 and 170. The first sense amplifying block 150 is coupled to the first cell array 110 and the second cell array 130; and the second sense amplifying block 170 is coupled to the second cell array 130 and the fifth cell array 180.

Herein, each of the plurality of sense amplifying blocks 150 and 170 has a plurality of sense amplifiers. The number of plural sense amplifiers corresponds to the number of the bit line pair coupled to one cell array.

On the other hand, in case of the shared bit line sense amplifier structure, the number of plural sense amplifiers corresponds to the number of two bit line pairs because two cell arrays hold one sense amplifying block in common for implementing a higher integrated circuit.

In detail, referring to FIG. 3, under the shared bit line sense amplifier structure, the first sense amplifier 150 is provided with the first and the second cell arrays 110 and 130 in common.

Under the shared bit line sense amplifier structure, the first sense amplifying block 150 further includes first and second connection blocks 151 and 153. Since the bit line sense amplifying block is commonly coupled to two neighbor cell arrays 110 and 130, there should be control for connecting or disconnecting the first sense amplifying block 150 to one of the two neighbor cell arrays 110 and 130. Each of the first and the second connection blocks 151 and 153 has a plurality of switching units, e.g., transistors. The plurality of transistors, e.g., MN1 to MN4, in the first connection block 151 is turned on or off based on a first connection control signal BISH1; and the plurality of transistors, e.g., MN5 to MN8, in the second connection block 153 is turned on or off based on a second connection control signal BISL1.

For instance, if the first connection control signal BISH1 is activated, all transistors included in the first connection block 151 is turned on, that is, the first cell array 110 is coupled to the sense amplifier block 152 of the first sense amplifying block 150. Otherwise, if the second connection control signal BISL1 is activated, all transistors included in the second connection block 153 is turned on, that is, the second cell array 130 is coupled to the sense amplifier block 152 of the first sense amplifying block 150.

Likewise, another sense amplifying block 170 includes a plurality of sense amplifiers and two connection blocks controlled in response to other connection control signals BISH2 and BISL2 for connecting or disconnecting a sense amplifier block of the bit line sense amplifying block 170 to one of the two neighbor cell arrays 130 and 180.

Moreover, each sense amplifying block, e.g., 150 and 170, further includes a precharge block and a data output block besides the first and the second connection blocks 151 and 153 and sense amplifiers.

FIG. 4 is a block diagram depicting the first sense amplifying block 150 shown in FIG. 2.

As shown, the bit line sense amplifying block 150 includes first and second connection blocks 151a and 153a, a sense amplifier 152a, a precharge block 155a, first and second equalization blocks 154a and 157a and a data output block 156a.

The sense amplifier 152a amplifies the potential difference between the bit line BL and the bit line bar /BL based on first and second sense amplifier power supply signals SAP and SAN. The precharge block 155a precharges the bit line pair BL and /BL as a bit line precharge voltage VBLP, enabled by a precharge signal BLEQ activated when the sense amplifier 152a is inactivated. The first equalization block 154a makes a voltage level of the bit line BL be same to a voltage level of the bit line bar /BL in response to the precharge signal BLEQ, wherein the bit line pair BL and /BL is coupled to the first cell array 110 (not shown). Similar to the first equalization block 154a, the second equalization block 157a is also used for making a voltage level of the bit line BL be same to a voltage level of the bit line bar /BL in response to the precharge signal BLEQ, wherein the bit line pair BL and /BL is coupled to the second cell array 130 (not shown). Lastly, the data output block 156a outputs data amplified by the sense amplifier 152a to the local data bus line pair LDB and LDBB based on a column control signal YI generated from the column address.

Herein, the bit line sense amplifying block 150 further includes first and second connection blocks 151a and 153a, each for connecting or disconnecting the sense amplifier 152a to one of neighbor cell arrays respectively based on first and second connection control signals BISH and BISL.

FIG. 5 is a waveform showing an operation of the conventional semiconductor memory device. Hereinafter, referring to FIGS. 1 to 5, the operation of the conventional semiconductor memory device is described in detail.

As shown, the read operation can be split into four steps: a precharge step, a read step, a sense step and a restore step. Likewise, the write operation is very similar to the read operation except that the write operation includes a write step instead of the read step in the read operation and, more minutely, a sensed and amplified data is not outputted but an inputted data from an external circuit is latched in the sense amplifier during the sense step.

Hereinafter, it is assumed that a capacitor of a unit cell is charged, i.e., stores a logic high level "1". Also, it is assumed that during the read operation, the first connection block 151a is enabled and the second connection block 153a is disabled so that the sense amplifier 152a is coupled to the first cell array 110.

In the precharge step, the bit line BL and the bit line bar /BL are precharged by the bit line precharge voltage VBLP. At this time, all word lines are inactivated. Generally, the bit line precharge voltage VBLP is a half of a core voltage VCORE, i.e., VCORE/2=VBLP.

In the precharge step, the precharge signal BLEQ is activated as a logic high level so that the first and the second equalization blocks 154a and 157a are also enabled. Thus, the bit line BL and the bit line bar /BL are percharged as the half of the core voltage VCORE. Herein, the first and the second connection block 151a and 153a are also activated, i.e., all transistors included in the first and the second connection block 151a and 153a are turned on.

As shown in FIG. 5, a symbol 'SN' means a potential level charged in the capacitor of the unit cell. During the precharge step, 'SN' has a level of the core voltage VCORE as a logic high level "1".

In the read step, a read command is inputted and carried out. Herein, the first connection block 151a is coupled to the first cell array 110 and the second connection block 153a is coupled to the second cell array 130. As a result, the sense amplifier 152a is coupled to the first cell array 110 and isolated from the second cell array 130 because the first connection block 151a is activated and the second connection block 153a is inactivated.

In addition, the word line corresponding to the inputted row and column addresses is activated as a high voltage VPP until the restore step. Herein, the reason why the word line is activated as the high voltage VPP higher than the source voltage VDD that data stored in a capacitor with the logic high level "1" is reduced by the threshold voltages of a plurality of NMOS transistors constituting the unit cell during transferring to the bit line BL.

As the source voltage VDD of the semiconductor memory device becomes lower, an operating speed becomes faster. Accordingly, the high voltage VPP, which is higher than the core voltage VCORE supplied with the cell area of the semiconductor memory device, is generated for activating the word lines. As a result, it is possible to activate the word lines at a high speed.

If the word line is activated, a plurality of MOS transistors within the unit cell corresponding to the word line is turned on; and the data stored in the capacitor of the unit cell is delivered into the bit line BL.

Thus, the bit line BL precharged as the half of the core voltage is boosted up by a predetermined voltage level ΔV. Herein, though the capacitor is charged as the core voltage VCORE, a voltage level of the bit line BL is increased not to the core voltage VCORE but to the predetermined voltage level ΔV because a capacitance Cc of the capacitor is smaller than a parasitic capacitance Cb of the bit line BL.

Referring to FIG. 5, in the read step, it is understood that the voltage level of the bit line BL is increased by the predetermined voltage level ΔV from the core voltage VCORE. At the same time, a voltage level of the symbol 'SN' is also increased to the predetermined voltage level ΔV from the core voltage VCORE.

At this time, i.e., when the data is delivered into the bit line BL, no data is delivered into the bit line bar /BL and, then, the bit line pair BL and /BL maintains a level of the half of the core voltage VCORE.

Next, in the sense step, the first sense amplifier power supply signal SAP is supplied with the core voltage VCORE and the second sense amplifier power supply signal SAN is supplied with the ground voltage GND. Then, the sense amplifier can amplify a voltage difference, i.e., the potential difference, between the bit line BL and the bit line bar /BL by using the first and the second sense amplifier power supply signals SAP and SAN. At this time, a relatively high side between the bit line BL and the bit line bar /BL is amplified to the core voltage VCORE; and the other side, i.e., a relatively low side between the bit line BL and the bit line bar /BL, is amplified to the ground voltage GND.

Herein, the voltage level of the bit line BL is higher than that of the bit line bar /BL. That is, after amplifying the bit line BL and the bit line bar /BL, the bit line BL is supplied with the core voltage VCORE and the bit line bar /BL is supplied with the ground voltage GND.

Lastly, in the restore step, the data outputted from the capacitor during the read step for boosting up the bit line BL by the predetermined voltage level ΔV is restored in the original capacitor. That is, the capacitor is re-charged. After the restore step, the word line corresponding to the capacitor is inactivated.

Then, the conventional semiconductor memory device carries out the precharge step again. Namely, the first and the second sense amplifier power supply signals SAP and SAN are respectively supplied with the half of the core voltage VCORE. Also, the precharge signal BLEQ is activated and inputted to the first and the second equalization blocks 154a and 157a and the precharge block 155a. At this time, the sense amplifier 152a is coupled to the two neighbor cell arrays, e.g., 110 and 130, by the first and the second connection blocks 151a and 153a.

As a design technology for a semiconductor memory device is rapidly developed, a voltage level of a source voltage for operating the semiconductor memory device becomes lower. However, though the voltage level of the source voltage becomes lower, it is requested that an operation speed of the semiconductor memory device becomes faster.

For achieving the request about the operation speed of the semiconductor memory device, the semiconductor memory device includes an internal voltage generator for generating a core voltage VCORE having a lower voltage level than the source voltage VDD and a high voltage VPP having a higher voltage level than the core voltage VCORE.

Until now, a requested operation speed can be achieved by implementing a nano-scale technology for manufacturing the semiconductor memory device through using above described manner for overcoming a decrease of the voltage level of the source voltage VDD without any other particular method.

For example, through a voltage level of the source voltage is decreased from about 3.3 V to about 2.5 V or under 2.5 V, the requested operation speed can be achieved if the nano-scale technology is implemented based on from about 500 nm to about 100 nm. That is, as the nano-scale technology is upgraded, i.e., developed, a power consumption of a fabricated transistor included in the semiconductor memory device is reduced and, if the voltage level of the source voltage is not decreased, an operation speed of the fabricated transistor becomes faster.

However, on the nano-technology based on under 100 nm, it is very difficult to develop the nano-technology. That is, there is a limitation for integrating the semiconductor memory device more and more.

Also, a requested voltage level of the source voltage becomes lower, e.g., from about 2.0 V to about 1.5 V or so far as about 1.0 V. Thus, the request about the source voltage cannot be achieved by only developing the nano-technology.

If a voltage level of the supply voltage inputted to the semiconductor memory device is lower than a predetermined voltage level, an operating margin of each transistor included in the semiconductor memory device is not sufficient; and, as a result, a requested operation speed is not satisfied and an operation reliability of the semiconductor memory device is not guaranteed.

Also, the sense amplifier needs more time for stably amplifying a voltage difference between the bit line BL and the bit line bar /BL because a predetermined turned-on voltage, i.e., a threshold voltage, of the transistor is remained under a low supply voltage.

Moreover, if a noise is generated at the bit line pair BL and /BL, each voltage level of the bit line BL and the bit line bar /BL is fluctuated, i.e., increased or decreased by a predetermined level on the half of the core voltage VCORE. That is, as the voltage level of the source voltage becomes lower, a little noise can seriously affect the operation reliability of the semiconductor memory device.

Therefore, there is a limitation for decreasing a voltage level of the source voltage under a predetermined level.

In addition, as the semiconductor memory device is more integrated, a size of the transistor becomes smaller and a distance between a gate of the transistor and the bit line gets near more and more. As a result, a bleed current is generated. Herein, the bleed current means a kind of leakage current between the gate of the transistor and the bit line because of a physical distance between the gate of the transistor and the bit line under a predetermined value.

FIG. 6 is a cross-sectional view describing a unit cell of the semiconductor memory device in order to show a cause of the bleed current.

As shown, the unit cell includes a substrate 10, an device isolation layer 11, source and drain regions 12a and 12b, a gate electrode 13, a capacitor 14 to 16, a bit line 17 and insulation layers 18 and 19. Herein, the symbol 'A' means a distance between the gate electrode 13 of the transistor and the bit line 17.

As it is rapidly developed the nano-technology for manufacturing the semiconductor memory device, the distance between the gate electrode 13 of the transistor and the bit line 17, i.e., 'A', becomes shorter.

In the precharge step, the bit line BL is supplied with the half of the core voltage and the gate electrode 13, i.e., a word line, is supplied with the ground voltage.

If the bit line 17 and the gate electrode 13 in the unit cell are electronically short since an error is occurred under a manufacturing process, a current is flown continuously during the precharge step and a power consumption is increased. In this case, the semiconductor memory device includes a plurality of additional unit cells for substituting the unit cell where the bit line and the gate electrode are short-circuited. At this time, unit cells having a defect are substituted with preliminary unit cells in word line basis.

Otherwise, if there is no error under the manufacturing process, i.e., the bit line 17 and the gate electrode 13 in a unit cell are not electronically short-circuited in any unit cell of the semiconductor memory device, there is no bleed current. However, if the distance between the gate electrode 13 of the transistor and the bit line 17, i.e., 'A', is too short without any error under the manufacturing process, the bleed current is generated and flown.

Recently, how to operate a semiconductor memory device under a low power condition is very important. If above described bleed current is generated, it is not appreciate that the semiconductor memory device having the bleed current is applied to a system though the semiconductor memory device can be normally operated.

For reducing an amount of the bleed current, it is suggested that a resistor is added between the gate electrode of the transistor and the bit line. However, although the resistor can reduce little amount of the bleed current, this is not effective and essential for reducing and protecting a flow of the bleed current.

Further, the conventional semiconductor memory device has another problem. That is, there exists a bleed current between a sense amplifier and a disconnected cell array. As above-mentioned, when one cell array is connected to the sense amplifier, the other cell array is disconnected from the cell array by turning off a MOS transistor included in the corresponding connection block. Herein, a bit line pair of the disconnected cell array has a voltage level of about the half of the source voltage VDD; and one bit line and the other bit line of the sense amplifier have a voltage level of the source voltage VDD and a voltage level of the ground voltage GND respectively.

Accordingly, even though the connection block is turned off, the bleed current is flown from the disconnected cell array to the sense amplifier such as "Sub_Vt Leak Current" shown in FIG. 4. This bleed current causes a current increase during a data access operation.

SUMMARY OF THE INVENTION

It is, therefore, an object of the present invention to provide a semiconductor memory device for operating in a fast speed under a low power condition and protecting a bleed current from generating to thereby reduce a power consumption. In particular, there is provided a layout of a sense amplifying block of the semiconductor memory device.

In accordance with an aspect of the present invention, there is provided a semiconductor memory device having a folded bit line structure and operating with a source voltage and a ground voltage, including: a first first-type well including a first cell array for providing data to a first bit line or a first bit line bar selected among a plurality of bit lines, and a first precharge MOS transistor having a second-type channel for equalizing voltage levels of the first bit line and the first bit line bar during a precharge period; a first second-type well including a first sense amplifying MOS transistor having a first-type channel among a plurality of sense amplifying MOS transistors for sensing and amplifying a signal difference between the first bit line and the first bit line bar, and a first connection MOS transistor having a first-type channel for connecting or disconnecting the first bit line and the first bit line bar to or from the first sense amplifying MOS transistor; and a second first-type well including a second sense amplifying MOS transistor having a second-type channel among the plurality of sense amplifying MOS transistors for sensing and amplifying the signal difference between the first bit line and the first bit line bar.

In accordance with another aspect of the present invention, there is provided a semiconductor memory device device having a folded bit line structure and operating with a source voltage and a ground voltage, including: a first well including a first cell array for providing data to a first bit line or a first bit line bar selected among a plurality of bit lines; a second well including a second cell array for providing data to a second bit line or a second bit line bar selected among the plurality of bit lines; a third well including a first sense amplifying MOS transistor having a first-type channel among a plurality of sense amplifying MOS transistors provided in a bit line sense amplifier, a first connection unit for connecting or disconnecting the first bit line and the first bit line bar to or from the bit line sense amplifier, and a second connection unit for connecting or disconnecting the second bit line and the second bit line bar to or from the bit line sense amplifier; and a fourth well including a second sense amplifying MOS transistor having a second-type channel among the plurality of sense amplifying MOS transistors provided in the bit line sense amplifier.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
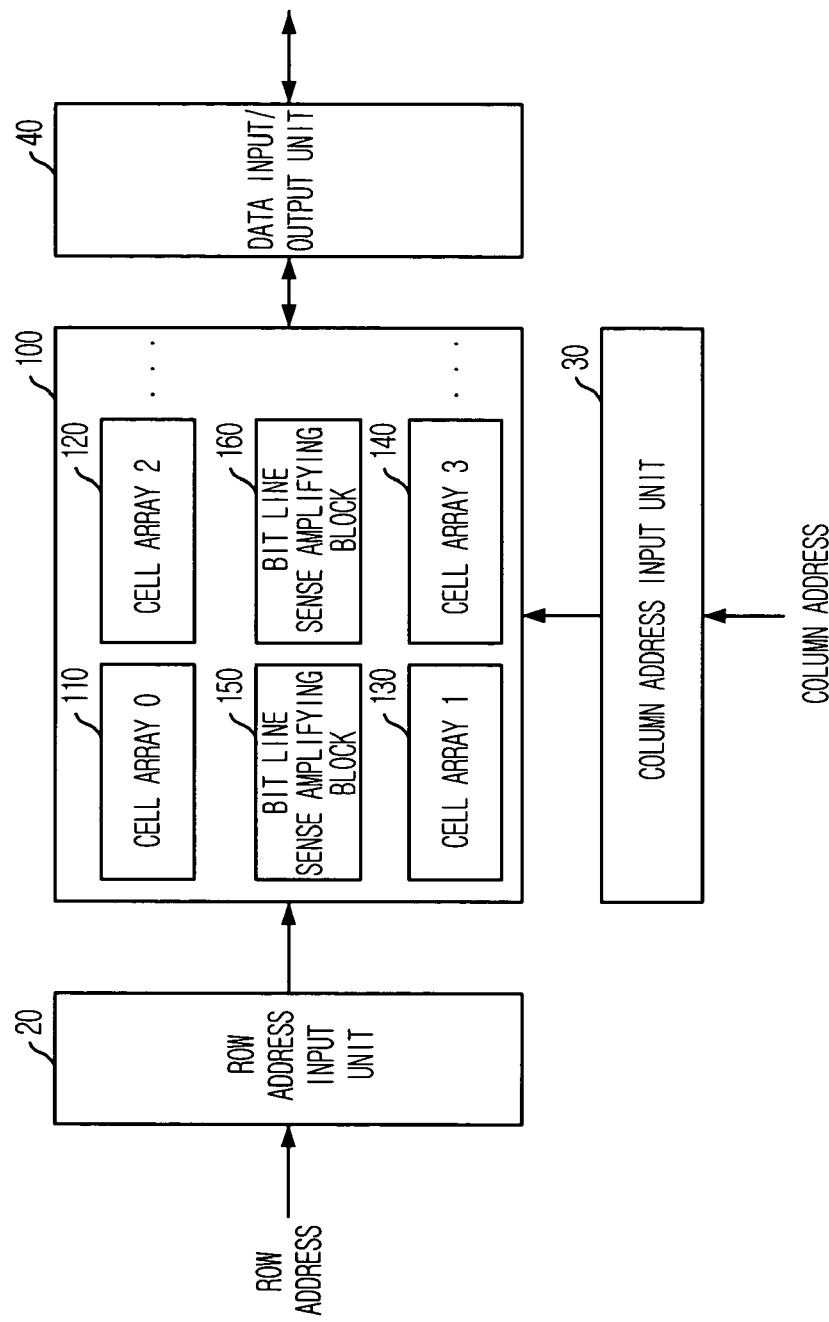
FIG. 1 is a block diagram showing a core area of a conventional semiconductor memory device.
Figure 2:
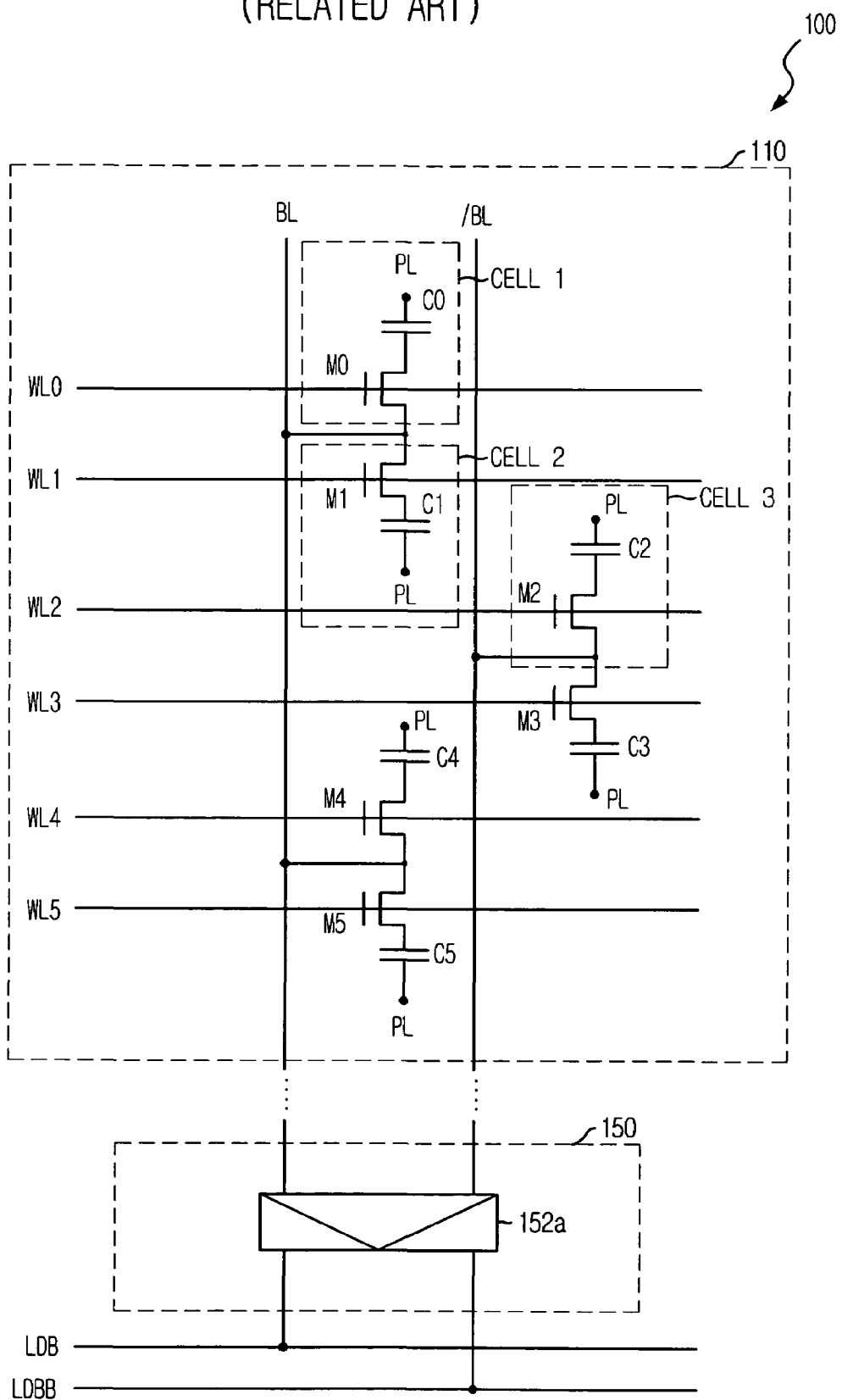
FIG. 2 is a block diagram depicting a detailed structure of the cell area shown in FIG. 1.
Figure 3:
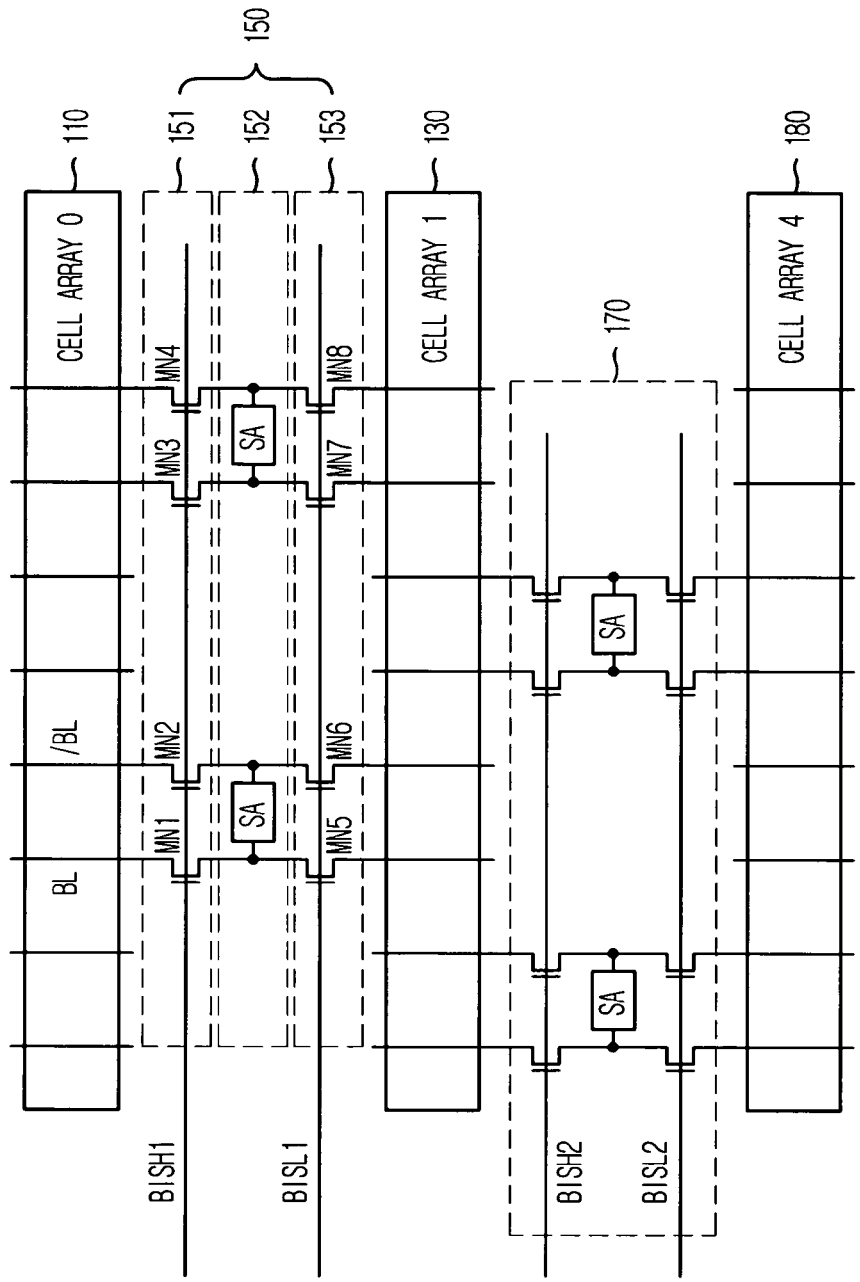
FIG. 3 is a block diagram describing a connection between each cell array and each sense amplifying block included in the cell area shown in FIG. 1.
Figure 4:
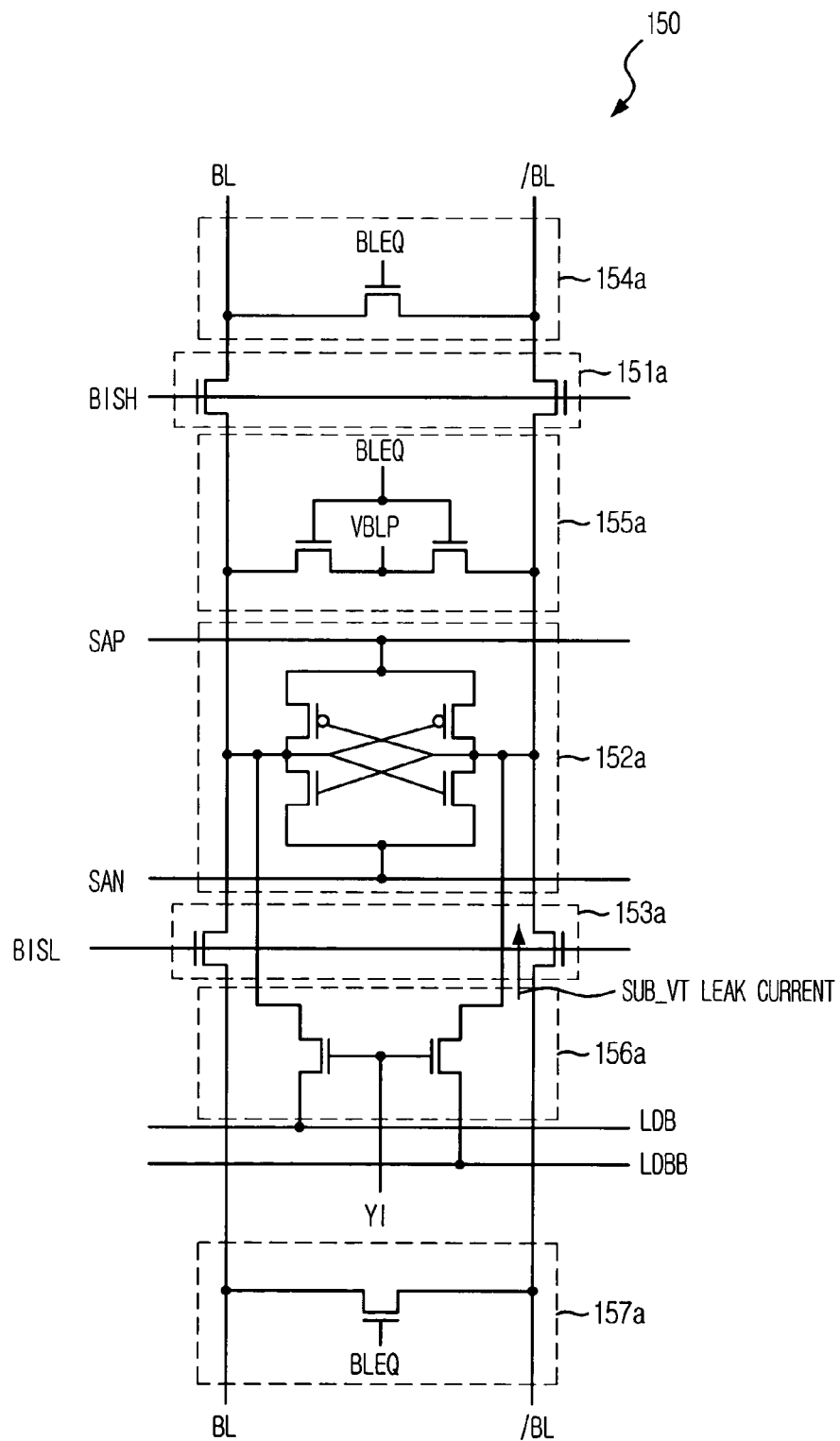
FIG. 4 is a block diagram depicting the bit line sense amplifying block shown in FIG. 2.
Figure 5:
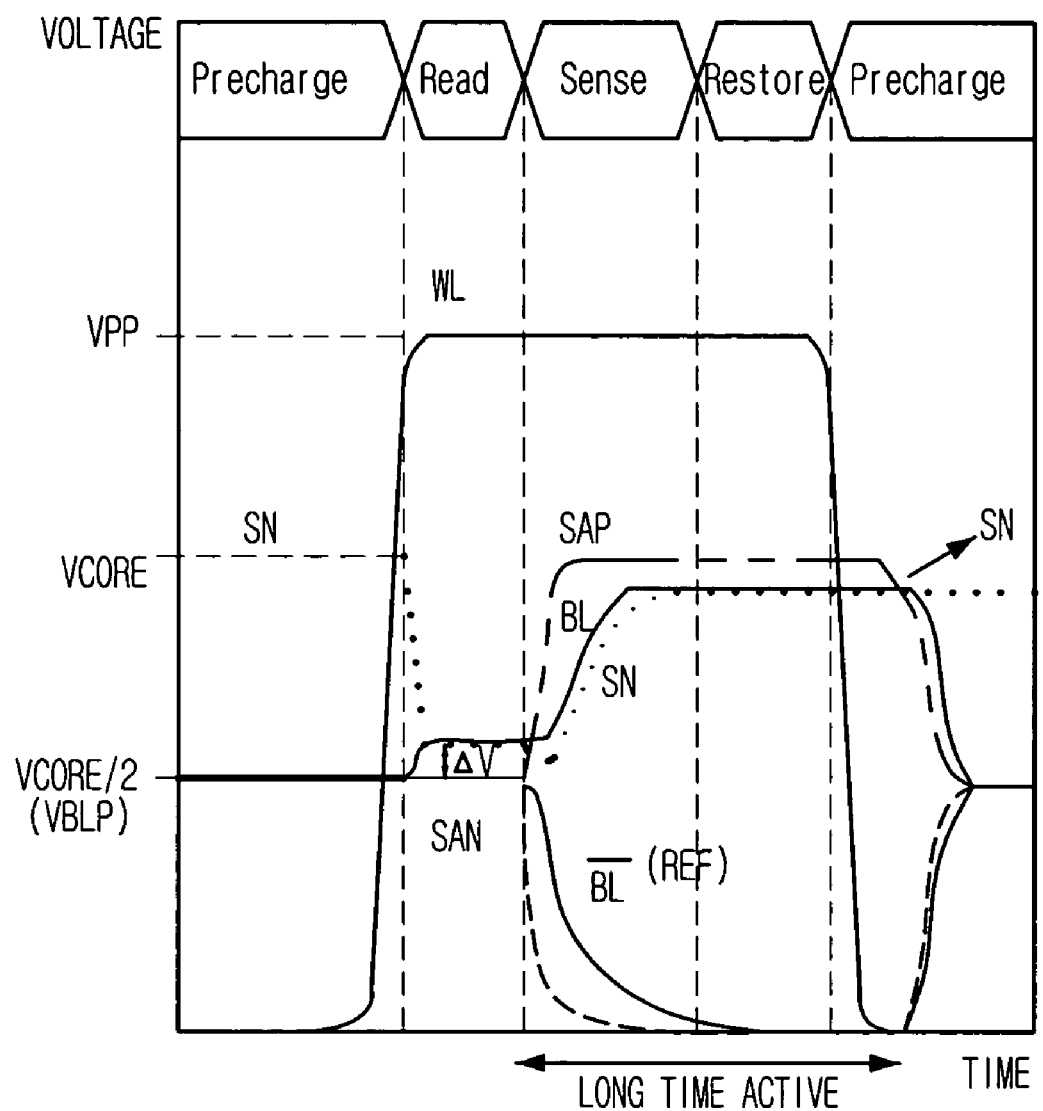
FIG. 5 is a waveform showing an operation of the conventional semiconductor memory device.
Figure 6:
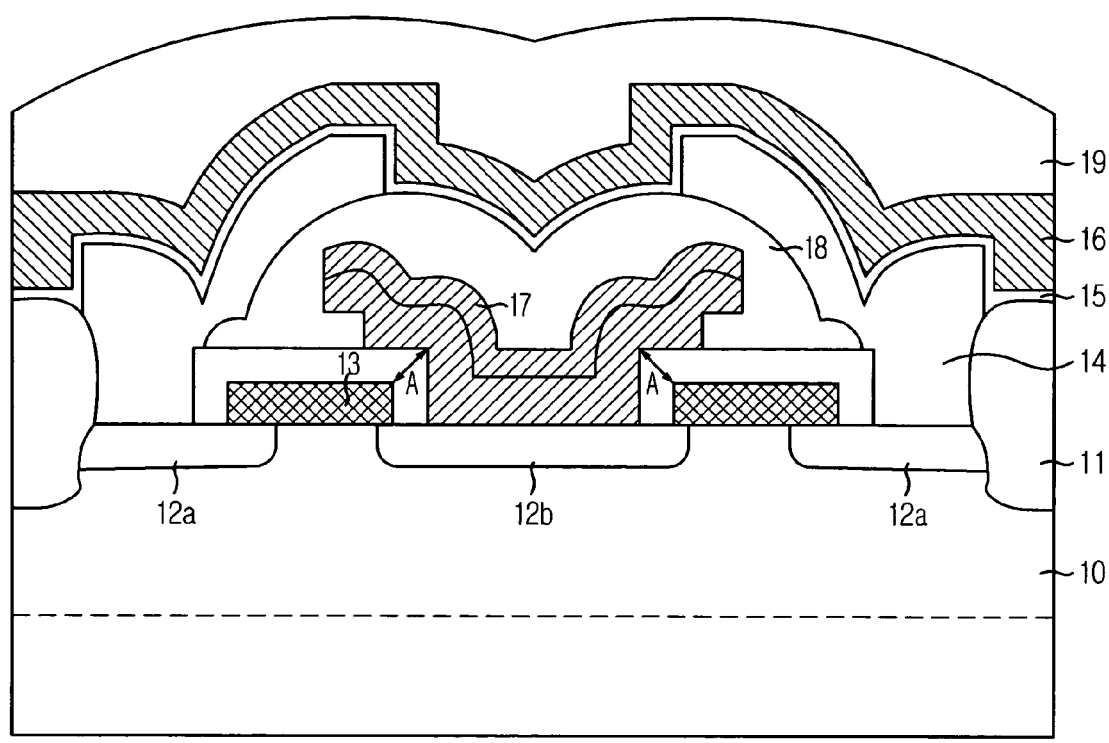
FIG. 6 is a cross-sectional view describing a unit cell of the semiconductor memory device in order to show a cause of a bleed current.
Figure 7:
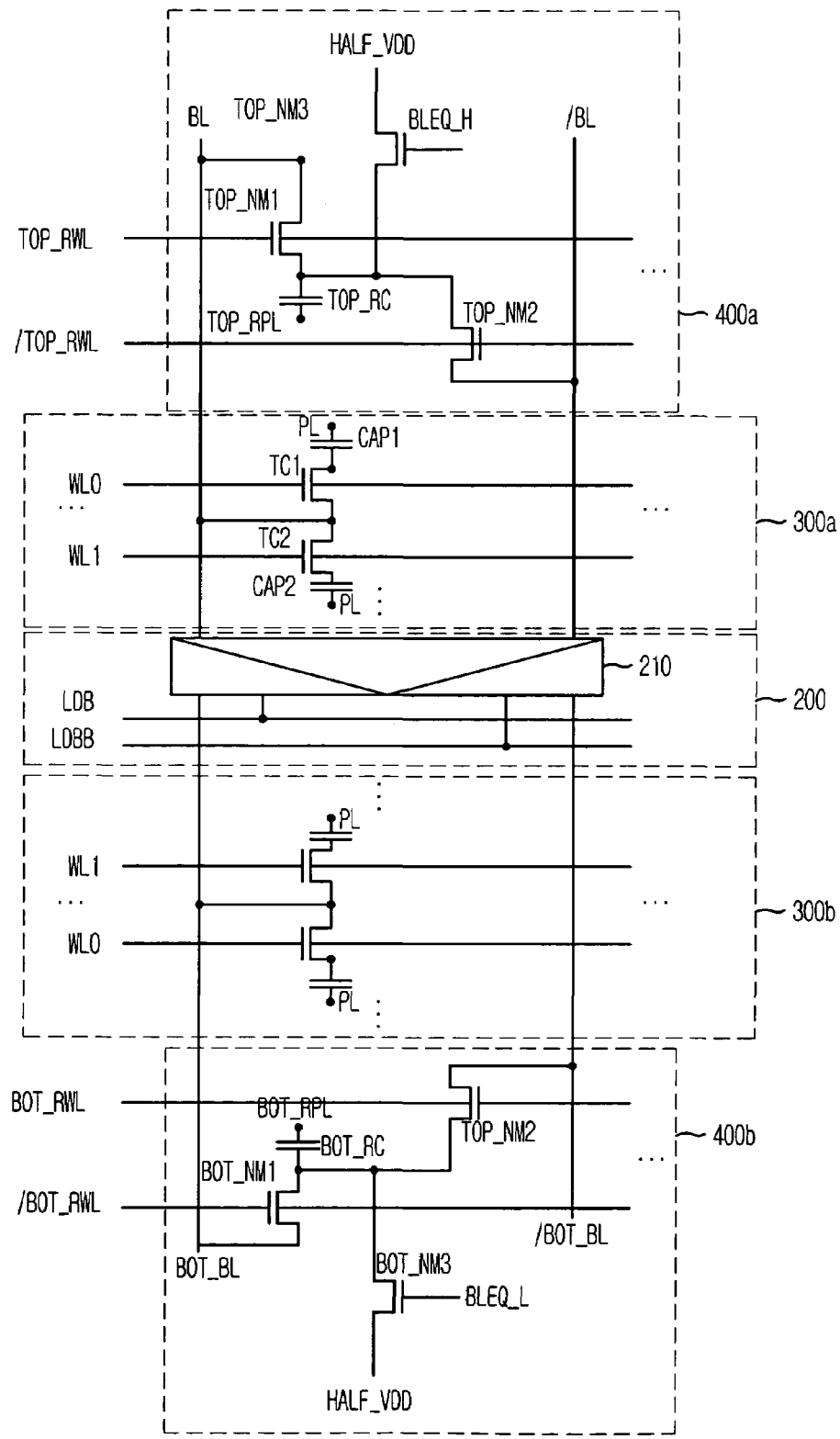
FIG. 7 is a block diagram showing a semiconductor memory device in accordance with an embodiment of the present invention.
Figure 8:
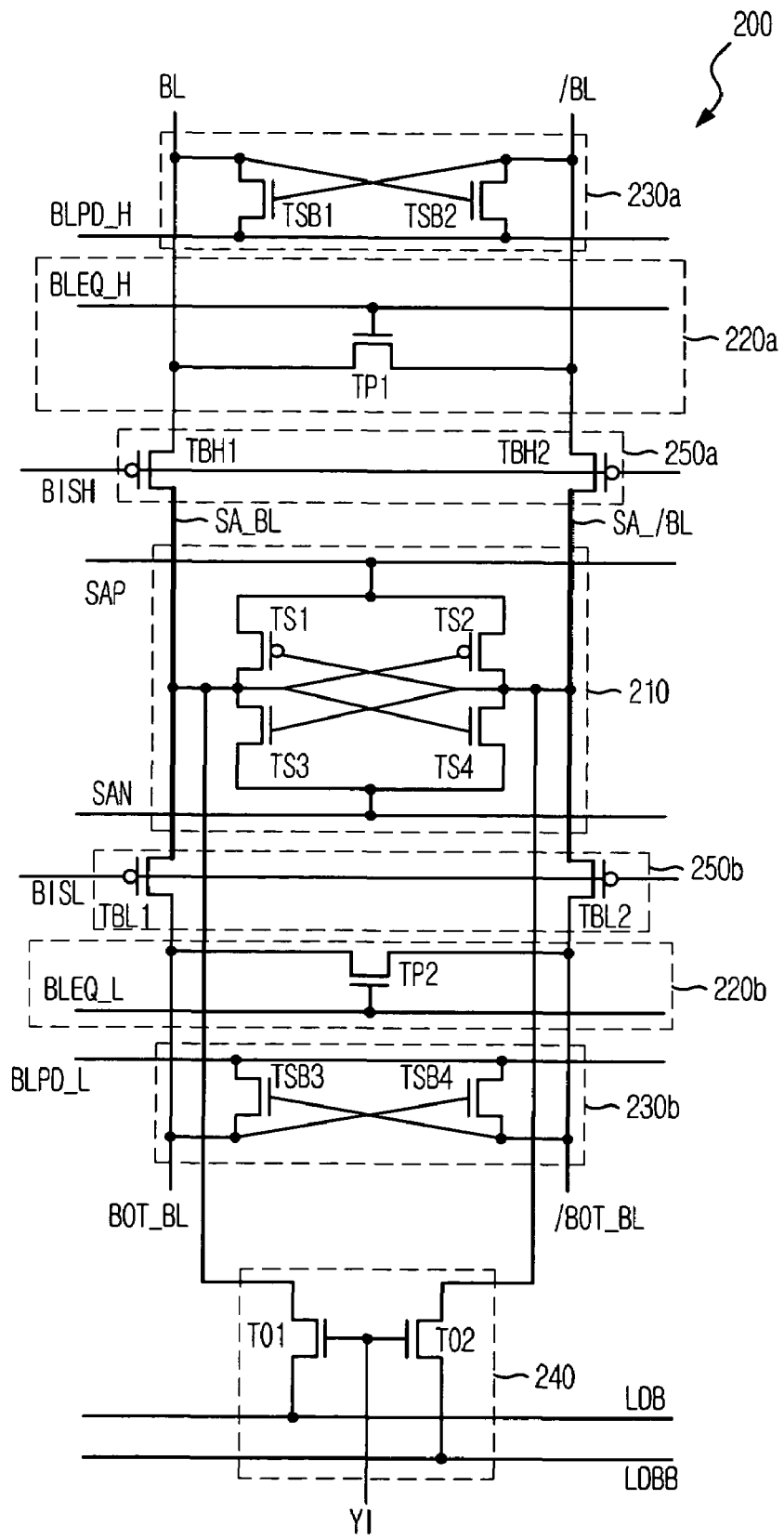
FIG. 8 is a schematic circuit diagram depicting a sense amplifying block of the semiconductor memory device shown in FIG. 7.

FIG. 7 is a block diagram showing a semiconductor memory device in accordance with an embodiment of the present invention. FIG. 8 is a schematic circuit diagram depicting a sense amplifying block of the semiconductor memory device shown in FIG. 7.

As shown, the semiconductor memory device according to the present invention has a folded bit line structure and operates by receiving a source voltage VDD and a ground voltage GND and includes a plurality of unit cells, each of which has an NMOS transistor and a capacitor.

In detail, the semiconductor memory device includes a first cell array 300a, a bit line sense amplifying block 200 and a first reference cell block 400a. The first cell array 300a stores data and outputs the data to a first bit line BL or a first bit line bar /BL selected among a plurality of bit lines provided in the plurality of unit cells. The bit line sense amplifying block 200 has a bit line sense amplifier 210 for sensing and amplifying a potential difference between data signals loaded on the first bit line BL and the first bit line bar /BL. The first reference cell block 400a transfers a reference signal to the first bit line bar /BL when the data is outputted to the first bit line BL or to the first bit line BL when the data signal is outputted to the first bit line bar /BL.

The bit line sense amplifying block 200 further includes a first precharge unit 220a for equalizing the potential difference between the data signals of the first bit line BL and the first bit line bar /BL coupled to the first cell array 300a at a precharge operation. That is, during the precharge operation, the first precharge unit 220a floats the first bit line BL and the first bit line bar /BL by not proving a precharge voltage to the first bit line BL and the first bit line bar /BL.

The first reference cell block 400a includes a reference capacitor TOP_RC, a first reference switching NMOS transistor TOP_NM1 and a second reference switching NMOS transistor TOP_NM2.

The reference capacitor TOP_RC has one terminal coupled to a reference power supply terminal TOP_RPL. The first reference switching NMOS transistor TOP_NM1 is located between the other terminal of the reference capacitor TOP_RC and the first bit line BL so as to connect the other terminal of the reference capacitor TOP_RC to the first bit line BL when the data signal is delivered to the first bit line bar /BL when the data signal is delivered to the first bit line BL. The second reference switching NMOS transistor TOP_NM2 is located between the other terminal of the reference capacitor TOP_RC and the first bit line bar /BL so as to connect the other terminal of the reference capacitor TOP_RC to the first bit line bar /BL when the data signal is delivered to the first bit line BL.

Herein, a capacitance of the reference capacitor TOP_RC is substantially same to that of a cell capacitor of the unit cell, e.g., CAP1 and CAP2, included in the first cell array 300a. A voltage level at the reference power supply terminal TOP_RPL can be one of the ground voltages, a half of the source voltage VDD and the source voltage VDD.

The number of reference capacitors included in the first reference cell block 400a corresponds to the number of bit line pairs included in a corresponding cell array, i.e., the first cell array 300a. For instance, if the first cell array 300a includes 256 bit line pairs, the first reference cell block 400a includes 256 reference capacitors. Each reference capacitor is coupled to one of a corresponding bit line pair which carries no data signal to thereby deliver the reference signal stored in the reference capacitor to the coupled bit line.

Meanwhile, the bit line sense amplifying block 200 further includes a first connection unit 250a connected between the bit line sense amplifier 210 and the first precharge unit 220a for connecting or disconnecting the first bit line BL and the first bit line bar /BL included in the first cell array 300a to/from the bit line sense amplifier 210.

The first connection unit 250a includes a first connection PMOS transistor TBH1 and a second connection PMOS transistor TBH2. The first connection PMOS transistor TBH1 connects the first bit line BL to the bit line sense amplifier 210 in response to a first connection control signal BISH. The second connection PMOS transistor TBH2 connects the first bit line bar /BL to the bit line sense amplifier 210 in response to the first connection control signal BISH.

Also, the bit line sense amplifying block 200 further includes a first auxiliary bit line sense amplifier 230a for amplifying and maintaining a voltage level of a lower one of the first bit line BL and the first bit line bar /BL included between the first cell array 300a and the first connection unit 250a as a voltage level of the ground voltage GND. A first bit line control signal BLPD_H inputted to the first auxiliary bit line sense amplifier 230a has a voltage level of the ground voltage GND while the bit line sense amplifier 210 is operated.

In detail, the first auxiliary bit line sense amplifier 230a includes a first auxiliary NMOS transistor TSB1 and a second auxiliary NMOS transistor TSB2. The first auxiliary NMOS transistor TSB1 has one terminal for receiving the first bit line control signal BLPD_H which is activated when the bit line sense amplifier 210 is enabled, and the other terminal coupled to the first bit line BL which is connected between the first cell array 300a and the first connection unit 250a. A gate of the first auxiliary NMOS transistor TSB1 is coupled to the first bit line bar /BL connected between the first cell array 300a and the first connection unit 250a. Similarly, the second auxiliary NMOS transistor TSB2 has one terminal for receiving the first bit line control signal BLPD_H which is activated when the bit line sense amplifier 210 is enabled, and the other terminal coupled to the first bit line bar /BL connected between the first cell array 300a and the first connection unit 250a. A gate of the second auxiliary NMOS transistor TSB2 is coupled to the first bit line BL connected between the first cell array 300a and the first connection unit 250a.

The first precharge unit 220a includes a first precharge NMOS transistor TP1 for equalizing voltage levels of the first bit line BL and first bit line bar /BL in the first cell array 300a based on a first precharge signal BLEQ_H.

Meanwhile, in accordance with the preferred embodiment, a cell array has a folded bit line structure and also has a shared bit line structure, i.e., a bit line sense amplifier is commonly coupled two neighboring cell arrays. Therefore, the semiconductor memory device further includes a second cell array 300b coupled to the other side of the bit line sense amplifier 210; and a second connection unit 250b for connecting or disconnecting the second cell array 300b to/from bit line sense amplifier 210.

Similar to the first cell array 300a, the second cell array 300b stores data and outputs the data to a selected second bit line BOT_BL or a second bit line bar /BOT_BL. The second connection unit 250b connects or disconnects the second bit line BOT_BL and the second bit line bar /BOT_BL to/from the bit line sense amplifier 210.

Herein, the semiconductor memory device further includes a second reference cell block 400b and a second precharge unit 220b. The second reference cell block 400b transfers a reference signal to the second bit line bar /BOT_BL when the data signal is outputted to the second bit line BOT_BL or to the second bit line BOT_BL when the data signal is outputted to the second bit line bar /BOT_BL; and the second precharge unit 220b equalizes a potential difference between the second bit line BOT_BL and the second bit line bar /BOT_BL included in the second cell array 300b during the precharge operation. That is, the second precharge unit 220b floats the second bit line BOT_BL and the second bit line bar /BOT_BL by not proving the precharge voltage to the second bit line BOT_BL and the second bit line bar /BOT_BL during the precharge operation.

Meanwhile, the bit line sense amplifying block 200 further includes a second auxiliary bit line sense amplifier 230b connected between the second cell array 300b and the bit line sense amplifier 210 for amplifying and maintaining a voltage level of a lower one of the second bit line BOT_BL and the second bit line bar /BOT_BL included between the second cell array 300b and the second connection unit 250b as a voltage level of the ground voltage GND.

In detail, the second auxiliary bit line sense amplifier 230b includes a third auxiliary NMOS transistor TSB3 and a fourth auxiliary NMOS transistor TSB4. The third auxiliary NMOS transistor TSB3 has one terminal for receiving a second bit line control signal BLPD_L which is activated when the bit line sense amplifier 210 is enabled, and the other terminal coupled to the second bit line BOT_BL connected between the second cell array 300b and the second connection unit 250b. A gate of the third auxiliary NMOS transistor TSB3 is coupled to the second bit line bar /BOT_BL connected between the second cell array 300b and the second connection unit 250b. Similarly, the fourth auxiliary NMOS transistor TSB4 has one terminal for receiving the second bit line control signal BLPD_L which is activated when the bit line sense amplifier 210 is enabled, and the other terminal coupled to the second bit line bar /BOT_BL connected between the second cell array 300b and the second connection unit 250b. A gate of the fourth auxiliary NMOS transistor TSB4 is coupled to the second bit line BOT_BL connected between the second cell array 300b and the second connection unit 250b.

The second precharge blocks 220b includes a second precharge NMOS transistor TP2 for equalizing voltage levels of the second bit line BOT_BL and the second bit line bar /BOT_BL in the second cell array 300b based on a second precharge signal BLEQ_L.

Meanwhile, the bit line sense amplifier 210 includes first and second sense amplifying PMOS transistors TS1 and TS2, and first and second sense amplifying NMOS transistors TS3 and TS4.

A gate of the first sense amplifying PMOS transistor TS1 is connected to the first bit line bar /BL by the first connection unit 250a or to the second bit line bar /BOT_BL by the second connection unit 250b. One terminal of the first sense amplifying PMOS transistor TS1 receives a first sense amplifier power supply signal SAP and the other terminal is connected to the first bit line BL by the first connection unit 250a or to the second bit line BOT_BL by the second connection unit 250b.

Similarly, a gate of the second sense amplifying PMOS transistor TS2 is connected to the first bit line BL by the first connection unit 250a or to the second bit line BOT_BL by the second connection unit 250b. One terminal of the second sense amplifying PMOS transistor TS2 receives the first sense amplifier power supply signal SAP and the other terminal is connected to the first bit line bar /BL by the first connection unit 250a or to the second bit line bar /BOT_BL by the second connection unit 250b.

A gate of the first sense amplifying NMOS transistor TS3 is connected to the first bit line bar /BL by the first connection unit 250a or to the second bit line bar /BOT_BL by the second connection unit 250b. One terminal of the first sense amplifying NMOS transistor TS3 receives a second sense amplifier power supply signal SAN and the other terminal is connected to the first bit line BL by the first connection unit 250a or to the second bit line BOT_BL by the second connection unit 250b.

Similarly, a gate of the second sense amplifying NMOS transistor TS4 is connected to the first bit line BL by the first connection unit 250a or to the second bit line BOT_BL by the second connection unit 250b. One terminal of the second sense amplifying NMOS transistor TS4 receives the second sense amplifier power supply signal SAN and the other terminal is connected to the first bit line bar /BL by the first connection unit 250a or to the second bit line bar /BOT_BL by the second connection unit 250b.

In accordance with the embodiment of the present invention, the first sense amplifier power supply signal SAP is supplied with the source voltage VDD and the second sense amplifier power supply signal SAN is supplied with a low voltage VBB. Herein, the low voltage VBB has a lower voltage level than the ground voltage GND having a voltage level of about −0.5 V. As described above, the bit line sense amplifier 210 performs a sensing and amplifying operation by using the low voltage VBB and the source voltage VDD.

Meanwhile, the semiconductor memory device further includes a data input/output unit 240 for outputting data sensed and amplified by the bit line sense amplifier 210 through a local data bus line pair LDB and LDBB to an external circuit, and for delivering data inputted from the external circuit via the local data bus line pair LDB and LDBB to the bit line sense amplifier 210.

In detail, the data input/output unit 240 includes first and second input/output MOS transistors T01 and T02. A gate of the first input/output MOS transistor T01 receives a column control signal YI. One terminal of the first input/output MOS transistor T01 is connected to the first and the second bit lines BL and BOT_BL and the other terminal of the first input/output MOS transistor T01 is coupled to a first local data bus line LDB. Similarly, a gate of the second input/output MOS transistor T02 receives the column control signal YI; and one terminal of the second input/output MOS transistor T02 is connected to the first and the second bit line bars /BL and /BOT_BL and the other terminal of the second input/output MOS transistor T02 is coupled to a second local data bus line LDBB.

Figure 9:
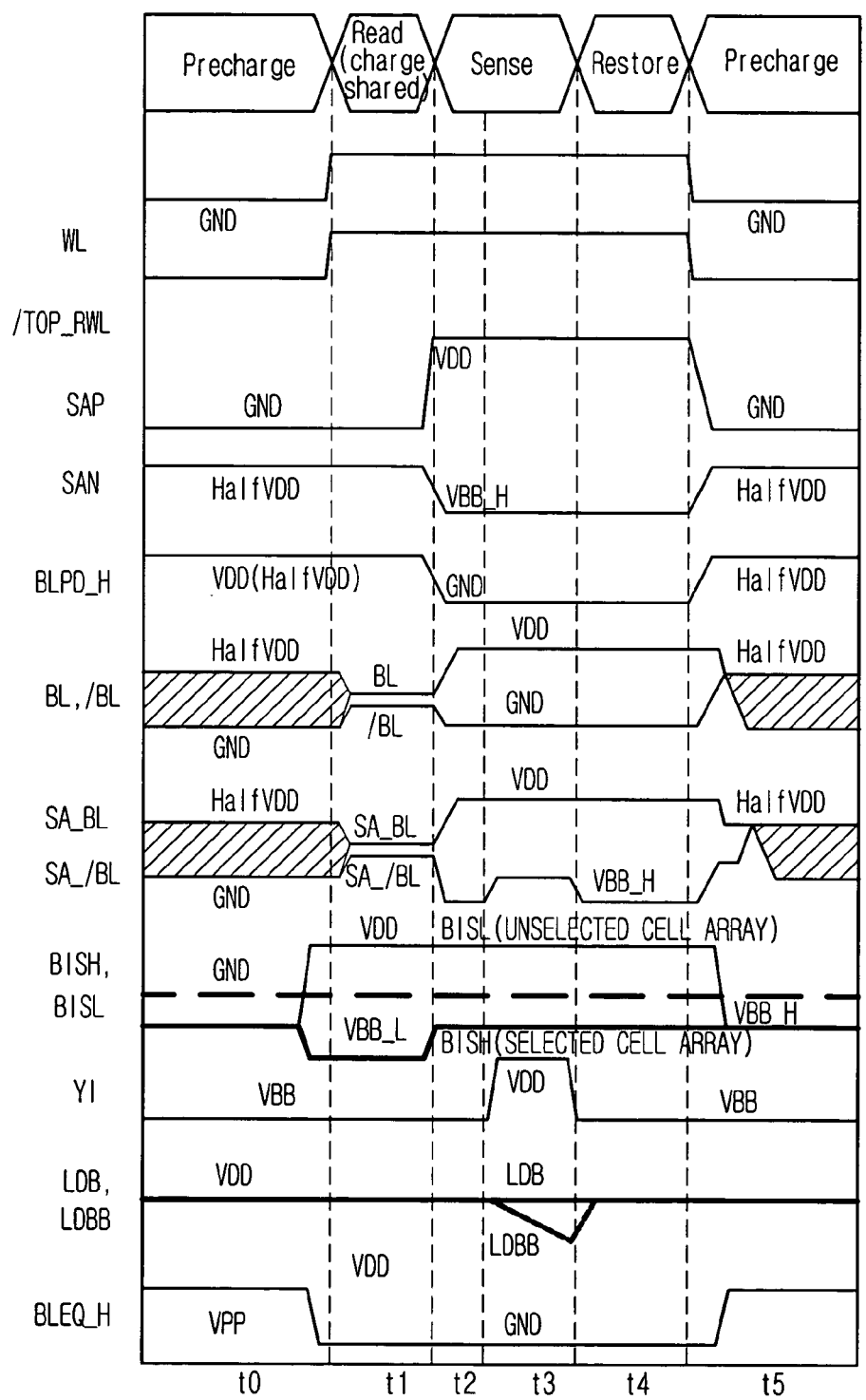
FIG. 9 is a timing diagram showing an operation of the semiconductor memory device shown in FIGS. 7 and 8.

FIG. 9 is a timing diagram showing an operation of the semiconductor memory device shown in FIGS. 7 and 8.

Referring to FIGS. 7 to 9, the operations of the semiconductor memory device according to the embodiment of the present invention are described below.

In accordance with the preferred embodiment of the present invention, the semiconductor memory device includes a reference cell block to float a bit line and a bit line bar by not proving the precharge voltage to the bit line and the bit line bar during a precharge step.

In addition, in the preferred embodiment of the present invention, the bit line sense amplifier performs a sensing and amplifying operation by not using the source voltage VDD and the ground voltage GND, but using the source voltage VDD and the low voltage VBB having the lower voltage level than the ground voltage GND, i.e., the voltage level of about −0.5 V, and the source voltage VDD.

Meanwhile, if the voltage level of the source voltage VDD is more decreased, it is possible that an absolute quantity of the source voltage VDD is equal to that of the low voltage VBB. In this case, a voltage level of the precharge voltage of the bit line can be maintained as the ground voltage GND by making voltage levels of two bit lines be same after a sensing operation of the bit line sense amplifier.

Meanwhile, as above-mentioned, the semiconductor memory device further includes an auxiliary bit line sense amplifier for maintaining a voltage level of a neighboring bit line pair as a half of the source voltage VDD by using the reference cell block and a precharge unit when the bit line sense amplifier is operated for a data access.

Hereinafter, the above-mentioned operations of the semiconductor memory device are described in detail. Herein, it is assumed that a read operation is performed for reading a high-level data '1', and the data is transferred to the first bit line BL.

A data access operation of the semiconductor memory device can be split into four steps: a precharge step, a read/write step, a sense step and a restore step.

At the precharge step, the first and the second precharge signals BLEQ_H and BLEQ_L are activated and maintain an enable state as a voltage level of a high voltage VPP so that voltage levels of a first bit line pair BL and /BL is equalized and voltage levels of a second bit line pair BOT_BL and /BOT_BL is also equalized.

As above-mentioned, in the present invention, since the precharge voltage is not supplied with the first bit line pair BL and /BL during the precharge step, the first bit line pair BL and /BL, a sense amplifier bit line pair SA_BL and SA_/BL and the second bit line pair BOT_BL and /BOT_BL is floated (t0). At this time, the first and the second connection units 250a and 250b are turned on; and the ground voltage GND is supplied with all word lines to thereby maintain an inactivated state.

Accordingly, the first bit line pair BL and /BL, the sense amplifier bit line pair SA_BL and SA_/BL and the second bit line pair BOT_BL and /BOT_BL keeps a voltage level of a half of the source voltage VDD at the precharge step by using the first and the second precharge units 220a and 220b right after a read/write operation is performed (After a sensing and amplifying operation is performed by the bit line sense amplifier 210, one of a bit line pair has a voltage level of the source voltage VDD and the other has a voltage level of the ground voltage GND). Thereafter, since the precharge voltage is not provided during the precharge step, the bit line voltage level of the half of the source voltage VDD is decreased as a period of the precharge step is longer. If the precharge step is more continuously performed so as not to enter the read/write step, the voltage level of the first bit line pair BL and /BL and the sense amplifier bit line pair SA_BL and SA_/BL is decreased to the ground voltage GND.

Therefore, a precharge voltage of each floated bit line has a variable voltage level between the half of the source voltage VDD and the ground voltage GND. As a result, a timing of performing the read/write operation determines the precharge voltage of each floated bit line.

Thereafter, at the read step, a single word line is selected by decoding inputted column and row addresses. All of the NMOS transistors corresponding to the selected word line are turned on and data stored in the cell capacitor is transferred to the first bit line BL through the turned-on NMOS transistor.

If the high-level data '1' is delivered to the first bit line BL, voltage levels of the first bit line BL and the sense amplifier bit line SA_BL, which have a voltage level between the half of the source voltage VDD and the ground voltage GND as above-mentioned, are increased by an amount of the high-level data '1'.

Meanwhile, a reference signal is inputted to the first bit line bar /BL and the sense amplifier bit line bar SA_/BL which have no data signal. A first reference word line bar /TOP_RWL having no data signal is activated and, thus, the second reference switching NMOS transistor TOP_NM2 is turned on. Accordingly, the reference signal stored in the reference capacitor TOP_RC is transferred to the first bit line bar /BL and the sense amplifier bit line bar SA_/BL and, thus, voltage levels of the first bit line bar /BL and the sense amplifier bit line bar SA_/BL are increased by an amount of a predetermined voltage level.

At this time, before the reference signal is inputted, voltage levels of the first bit line bar /BL and the sense amplifier bit line bar SA_/BL are gradually decreased from the half of the source voltage VDD so as to hold a predetermined voltage level, and then, the voltage levels of the first bit line bar /BL and the sense amplifier bit line bar SA_/BL are increased by an amount of a signal level of the reference signal.

As above-mentioned, the capacitance of the reference capacitor TOP_RC is substantially same to that of the cell capacitor of the unit cell, e.g., CAP1 and CAP2. A charge amount of the reference capacitor TOP_RC which stores the reference signal is a half of a charge amount of the cell capacitor of the unit cell, e.g., CAP1 and CAP2, which stores the high-level data '1'.

In other words, because reference power supply terminals, i.e., HALF_VDD, TOP_RPL and BOT_RPL, receive a voltage level of a half of the source voltage VDD, the charge amount of the reference capacitor TOP_RC which stores the reference signal is the half of the charge amount of the cell capacitor of the unit cell which stores the high-level data '1'. At this time, each of voltage levels supplied by the reference power supply terminals TOP_RPL and BOT_RPL is same to a voltage level of a plate voltage PL supplied with the cell capacitor of the unit cell, e.g., CAP1 and CAP2, included in a cell array.

At this time, the voltage level can have a voltage level of the source voltage VDD, a half of the source voltage VDD or the ground voltage GND. A voltage level which is same to the plate voltage PL is supplied to the reference power supply terminals TOP_RPL and BOT_RPL so that the reference signal can have a half signal level of the high-level data.

Accordingly, the signal level increase of the first bit line bar /BL which receives the reference signal is a half of that of the first bit line BL which receives the high-level data. For instance, when the source voltage VDD is 1.0V and there is a voltage increase by 0.2V due to the high-level data, the first bit line pair BL and /BL has a voltage level of about 0.5V at an initial state of the precharge step. Thereafter, as the precharge step is continued, it is assumed that each of the voltage levels of the first bit line pair BL and /BL is decreased to about 0.3V. At this time, if a read command is performed, the voltage level of the first bit line BL having the high-level data is increased to about 0.5V, i.e., 0.3V+0.2V, and the voltage level of the first bit line bar /BL having the reference signal which has the half signal level of the high-level data is increased to 0.4V, i.e., 0.3V+0.1V.

Meanwhile, the first precharge signal BLEQ_H is activated so as to enable the first precharge unit 220a during the precharge step and is inactivated so as to disable the first precharge unit 220a during the read, sense and restore steps.

Next, at the sense step, the first sense amplifier power supply signal SAP of the bit line sense amplifier 210 receives the source voltage VDD and the second sense amplifier power supply signal SAN receives a first negative low voltage VBB_H.

Therefore, the bit line sense amplifier 210 senses a voltage difference between the first bit line pair BL and /BL to thereby amplify a voltage level of a bit line having a higher voltage level, i.e., the first bit line BL, to a voltage level of the source voltage VDD and amplify a voltage level of a bit line having a lower voltage level, i.e., the first bit line bar /BL, to a voltage level of the ground voltage GND (t2).

Since the bit line sense amplifier 210 performs the amplifying operation by using the source voltage VDD and the first negative low voltage VBB_H, the amplifying operation can be performed at a high speed in comparison with using the source voltage VDD and the ground voltage GND.

Herein, a voltage level of the sense amplifier bit line bar SA_/BL included between the bit line sense amplifier 210 and the first connection unit 250a is amplified to the first negative low voltage VBB_H; however, the first bit line bar /BL included between the first cell array 300a and the first auxiliary bit line sense amplifier 230a is amplified to the ground voltage GND. Since the first connection control signal BISH inputted to each gate of the first and the second connection PMOS transistors TBH1 and TBH2 included in the first connection unit 250a has a voltage level of the first negative low voltage VBB_H, even though the sense amplifier bit line bar SA_/BL coupled to the bit line sense amplifier 210 is amplified to the first negative low voltage VBB_H, the first bit line bar /BL coupled to the first cell array 300a is amplified to the ground voltage GND which is higher than the first negative low voltage VBB_H.

Similarly, the second connection unit 250b performs a clamping operation so that a voltage level of the first negative low voltage VBB_H is not transferred to a bit line coupled to the second cell array 300b even though the bit line sense amplifier 210 amplifies the sense amplifier bit line bar SA_/BL to the first negative low voltage VBB_H. Also, since a parasitic capacitance occurred in the first bit line bar /BL is relatively larger than a sub-threshold voltage of the first and the second connection PMOS transistors TBH1 and TBH2 included in the first connection unit 250a, the first bit line bar /BL coupled to the first cell array 300a can keep the voltage level of the ground voltage GND during the sense step and the restore step.

Therefore, since a bit line pair coupled to a cell array can keep the voltage level of the ground voltage GND by preventing the first negative low voltage VBB_H amplified by the bit line sense amplifier 210 from being transferred to the bit line pair, a voltage variation of each bit line is minimized. As a result, an operational speed of the bit line sense amplifier 210 can be improved and a power consumption due to the voltage variation of each bit line coupled to each cell array can be reduced. For this, the first and the second connection units 250a and 250b are provided not only for controlling the connection between the bit line sense amplifier 210 and each cell array but also for preventing the first negative low voltage VBB_H from being transferred to the first bit line pair BL and /BL, the second bit line pair BOT_BL and /BOT_BL included in each cell array.

However, the first and the second connection units 250a and 250b are not enough for stably maintaining the voltage level of the first bit line pair BL and /BL included in the cell array as the ground voltage GND. Therefore, the first and the second auxiliary bit line sense amplifiers 230a and 230b are provided for maintaining the voltage level of the first bit line pair BL and /BL included in the first cell array 300a as the ground voltage GND even though the sense amplifier bit line pair SA_BL and SA_/BL coupled to the bit lines sense amplifier 210 are amplified to the first negative low voltage VBB_H.

The first and the second auxiliary bit line sense amplifiers 230a and 230b amplify and maintain one of the first bit line pair BL and /BL included in the first cell array 300a, which has a lower voltage level than the other, as the voltage level of the ground voltage GND while the bit line sense amplifier 210 performs the sensing and amplifying operation.

For example, when the bit line sense amplifier 210 amplifies a voltage level of the sense amplifier bit line SA_BL to the source voltage VDD and amplifies a voltage level of the sense amplifier bit line bar SA_/BL to the first negative low voltage VBB_H, the first bit line BL keeps a voltage level of the source voltage VDD and the first bit line bar /BL keeps a voltage level of the ground voltage GND. At this time, the first auxiliary bit line sense amplifier 230a decreases a voltage level of the first bit line bar /BL so as to be the ground voltage GND when a voltage level of the first bit line bar /BL is higher than the ground voltage GND and increases a voltage level of the first bit line bar /BL so as to be the ground voltage GND when a voltage level of the first bit line bar /BL is lower than the ground voltage GND.

Meanwhile, the first and the second bit line control signals BLPD_H and BLPD_L respectively inputted to the first and the second auxiliary bit line sense amplifiers 230a and 230b are activated as the ground voltage GND during an activation period of the bit line sense amplifier 210, i.e., t2, t3 and t4.

As above-mentioned, gates of the first and the second auxiliary NMOS transistors TSB1 and TSB2 included in the first auxiliary bit line sense amplifier 230a are cross-coupled to the first bit line pair BL and /BL. Each one terminal of the first and the second auxiliary NMOS transistors TSB1 and TSB2 receive the ground voltage GND as the first bit line control signal BLPD_H to thereby maintain a lower voltage level of the first bit line pair BL and /BL as the ground voltage GND due to the cross-coupled gates of the first and the second auxiliary NMOS transistors TSB1 and TSB2.

Likewise, gates of the third and the fourth auxiliary NMOS transistors TSB3 and TSB4 included in the second auxiliary bit line sense amplifier 230b are cross-coupled to the second bit line pair BOT_BL and /BOT_BL. Each one terminal of the third and the fourth auxiliary NMOS transistors TSB3 and TSB4 receive the ground voltage GND as the second bit line control signal BLPD_L to thereby maintain a lower voltage level of the second bit line pair BOT_BL and /BOT_BL as the ground voltage GND due to the cross-coupled gates of the third and the fourth auxiliary NMOS transistors TSB3 and TSB4.

Since each unit cell included in each cell array is constituted with the NMOS transistor, i.e., TC1 and TC2, and the cell capacitor, i.e., CAP1 and CAP2, if the first negative low voltage VBB_H is transferred to the bit line included in the cell array when the bit line sense amplifier amplifies a bit line pair to the source voltage VDD and the first negative low voltage VBB_H, the NMOS transistor in the unit cell is turned on and data of an unselected unit cell may be lost. Therefore, it is required that the first negative low voltage VBB_H amplified by the bit line sense amplifier is not delivered to the bit line included in the cell array while the bit line sense amplifier is operated.

Meanwhile, each of the first and the second connection control signals BISH and BISL inputted to the first and the second connection unit 250a and 250b has two voltage levels: one is the first negative low voltage VBB_H having a negative voltage level whose absolute quantity is equal to each threshold voltage of a first and a fourth PMOS connection transistors TBH1, TBH2, TBL1 and TBL2 included in the first and the second connection units 250a and 250b and the other is a second negative low voltage VBB_L having a negative voltage level whose absolute quantity is larger than that of the first to the fourth connection PMOS transistors TBH1, TBH2, TBL1 and TBL2.

The first and the second connection control signals BISH and BISL are inputted as the first negative low voltage VBB_H for equalizing voltage levels of each bit line pair included in the first and the second cell arrays 300a and 300b, e.g., the first bit line pair BL and /BL, during the precharge step.

At the read step where the first cell array 300a is connected to the bit line sense amplifier 210 and the second cell array 300b is disconnected from the bit line sense amplifier 210, the second connection control signal BISL is provided as the source voltage VDD to disable the second connection unit 250b and the first connection control signal BISH is activated as a voltage level of the second negative low voltage VBB_L to enable the first connection unit 250a. Thereafter, at the sense step where the bit line sense amplifier 210 senses and amplifies a voltage difference between the sense amplifier bit line pair SA_BL and SA_/BL and the restore step, the activated first connection control signal BISH is provided as the first negative low voltage VBB_H.

As described above, during the precharge step, the relatively lower low voltage, i.e., the second negative low voltage VBB_L, is used for more reliable isolation between the bit line sense amplifier 210 and a bit line coupled to a cell array. Otherwise, the relatively higher low voltage, i.e., the first negative low voltage VBB_H, is used for the isolation between the bit line sense amplifier 210 and the bit line coupled to the cell array. This is for the bit line sense amplifier 210, which uses the first negative low voltage VBB_H, to perform the sensing and amplifying operation more quickly when the bit line sense amplifier 210 mainly performs the sensing and amplifying operation.

Thereafter, when the sensing and amplifying operation of the bit line sense amplifier 210 is completed, a column control signal YI is activated for a predetermined time. Then, in response to the column control signal YI, a data signal latched by the bit line sense amplifier 210 is outputted to the local data bus line pair LDB and LDBB (t3). At this time, the outputted data signal is data corresponding to the read command.

During the restore step, the data signal is restored to an original unit cell by using the data signal latched by the bit line sense amplifier 210 (t4).

When the restore step is completed, a corresponding word line, i.e., WL1 and WL2, is inactivated as a voltage level of the source voltage VDD, and the first and the second sense amplifier power supply signals SAP and SAN are respectively supplied with the ground voltage GND and the half of the source voltage VDD so that the bit line sense amplifier 210 is disabled.

In accordance with the conventional invention, since the local data bus line pair LDB and LDBB is precharged to the source voltage VDD or the half of the source voltage VDD while data is not transferred, a voltage level of a bit line (the sense amplifier bit line bar SA_/BL in this case) amplified to the ground voltage GND by the bit line sense amplifier 210 is increased to a predetermined voltage level during transferring the data amplified by the bit line sense amplifier 210. Accordingly, an enough time for the restore time should be provided for the increased voltage level of the sense amplifier bit line bar SA_/BL to be decreased to the ground voltage GND. Otherwise, a wrong data can be restored to the original unit cell; particularly, if an original data is '0', the original data is restored as '1'. For overcoming the above-mentioned problem, in the conventional invention, a period of the restore step (t4) should be long.

However, in accordance with the present invention, since the sense amplifier bit line bar SA_/BL is amplified to the first negative low voltage VBB_H lower than the ground voltage GND by the bit line sense amplifier 210, even though a current is flown to the first bit line bar /BL coupled to the bit line sense amplifier 210 by the local data bus line pair LDB and LDBB, a voltage level of the first bit line bar /BL coupled to the bit line sense amplifier 210 is not increased or at least not higher than the ground voltage GND because the flown current is compensated by the sense amplifier bit line bar SA_/BL having the first negative low voltage VBB_H. Accordingly, the period of the restore step (t4) can be decreased in comparison with the conventional invention.

Thereafter, when the first precharge signal BLEQ_H is activated as a logic high level, the first bit line pair BL and /BL has a same voltage level to be floated. Also, the first and the second connection signals BISH and BISL are provided as the first negative low voltage VBB_H and, thus, all of the bit lines BL, SA_BL, BOT_BL, /BL, SA_/BL and /BOT_BL are connected (t5).

As above-mentioned, at the initial state of the precharge step, the first bit line pair BL and /BL keeps the voltage level of the half of the source voltage VDD; however, each voltage level of the first bit line pair BL and /BL is decreased as time passes because the first bit line pair BL and /BL is floated not receiving a particular precharge voltage.

Meanwhile, while the first connection unit 250a is enabled, the second reference cell block 400b and the second precharge unit 220b are enabled so that each voltage level of the second bit line pair BOT_BL and /BOT_BL is maintained as the precharge voltage. In accordance with the present invention, while voltage levels of a bit line pair is maintained to have a same voltage level at the precharge step, the bit line pair is floated not being supplied with a special precharge voltage. Therefore, there is no particular precharge voltage which all of the bit lines keep at the precharge step.

Herein, the precharge voltage means a half of the source voltage VDD which a bit line pair maintains when the bit line pair has a same voltage level after one of the bit line pair has a voltage level of the source voltage VDD and the other has a voltage level of the ground voltage GND after performing a data read or write operation. That is, while the bit line sense amplifier 210 accesses data of a unit cell, a voltage level of the bit line pair which shares the bit line sense amplifier 210 and is not connected to the bit line sense amplifier 210 is maintained as the half of the source voltage VDD by using a corresponding precharge unit and a reference cell block.

Since a voltage level of a bit line included in an inactivated cell array is rapidly decreased due to a voltage difference between the second sense amplifier power supply signal SAN of the bit line sense amplifier for accessing data and a voltage level of the bit line included in the inactivated cell array, the above-mentioned operation is needed.

Although the first and the second connection unit 250a and 250b include the first to fourth connection PMOS transistors TBH1, TBH2, TBL1 and TBL2 which receive one of the first and the second connection control signals BISL and BISH between the first and the second sense amplifier power supply signals SAP and SAN and the bit line of the inactivated cell array, and even though the PMOS transistors are turned off, a sub-current still flows and the bit line included in the inactivated cell array is rapidly decreased due to a leakage current of the sub-current. If a size of the PMOS transistor is larger, the above-mentioned problem becomes more serious.

Generally, the semiconductor memory device keeps the precharge voltage as the half of the source voltage VDD. Herein, in the shared bit line structure, when the bit line sense amplifier senses and amplifies a voltage difference between a bit line pair coupled to one side of the bit line sense amplifier for a data accessing, the other bit line pair which does not serve to access data and is coupled to the other side of the bit line sense amplifier keeps a precharge voltage level as the half of the source voltage VDD. In this time, there occurs an error since the precharge voltage level is decreased due to a voltage difference between the precharge voltage and a ground voltage supply terminal of the bit line.

In accordance with the present invention, since the bit line pair which does not serve to access the data is floated at the precharge step, the above-mentioned problem does not occur. However, if the precharge voltage is maintained as the half of the source voltage VDD, the data access operation can be performed more effectively since the precharge voltage level of the half of the source voltage VDD is the most effective for sensing a high-level data and a low-level data.

Since the semiconductor memory device in accordance with the present invention maintains a voltage level of a bit line pair which neighbors with the bit line pair served for a data access as the half of the source voltage VDD by using the corresponding reference cell block and the corresponding precharge unit, all of bit line pairs which neighbor with the bit line pair for data accessing can keep a voltage level of the half of the source voltage VDD. Accordingly, the precharge voltage can be secured no generating a particular control signal.

The above-mentioned operation of the semiconductor memory device is described on the assumption that the high-level data '1' is read out. Hereinafter, an operation of the semiconductor memory device for read a low-level data '0' is described below.

In case that the low-level data '0' is read, a cell capacitor of a selected unit cell is discharged. Accordingly, a voltage level of the first bit line BL receiving the low-level data is not changed at the read step after the precharge step, i.e., t1. That is, the voltage level of the first bit line BL keeps a voltage level of the ground voltage GND.

Meanwhile, since the first bit line bar /BL receives a reference signal, a voltage level of the first bit line bar /BL is increased by a predetermined voltage level. Herein, an amount of the voltage increase of the first bit line bar /BL is determined by a charge quantity corresponding to the reference signal, i.e., a charge quantity stored in the reference capacitor TOP_RC.

Thereafter, the bit line sense amplifier 210 senses the voltage difference between the first bit line BL and the first bit line bar /BL to amplify the voltage level of the first bit line BL to the ground voltage GND and the voltage level of the first bit line bar /BL to the source voltage VDD respectively, then, the bit line sense amplifier 210 latches the amplified voltage levels. Herein, the voltage level of the first bit line BL included in the first cell array 300a is maintained as the ground voltage GND by the first connection unit 250a.

Since the remaining operations for reading the low-level data '0' is same to that for reading the high-level data '1', detailed descriptions are omitted.

Hereinafter, an operation of the semiconductor memory device for writing data can be also described as shown in FIGS. 8 and 9.

The write operation is very similar to the read operation. While a data signal sensed and amplified by the bit line sense amplifier 210 is outputted to the local data bus line pair LDB and LDBB during t3, a data signal inputted in response to a write command is transferred to the bit line sense amplifier 210 through the local data bus line pair LDB and LDBB at the write operation.

Then, the bit line sense amplifier 210 replaces a previously latched data signal with the delivered data signal, and the newly latched data signal is stored to a unit cell at the restore step (t4). The bit line sense amplifier 210 also performs a sensing and amplifying operation by using the source voltage VDD and the first negative low voltage VBB_H at the write operation.

As the above mentioned, the semiconductor memory device floats each of the first bit line pair BL and /BL at the precharge step, and the bit line sense amplifier 210 senses and amplifies a voltage difference between the first bit line pair BL and /BL by using the source voltage VDD and the first negative low voltage VBB_H.

Figure 10:
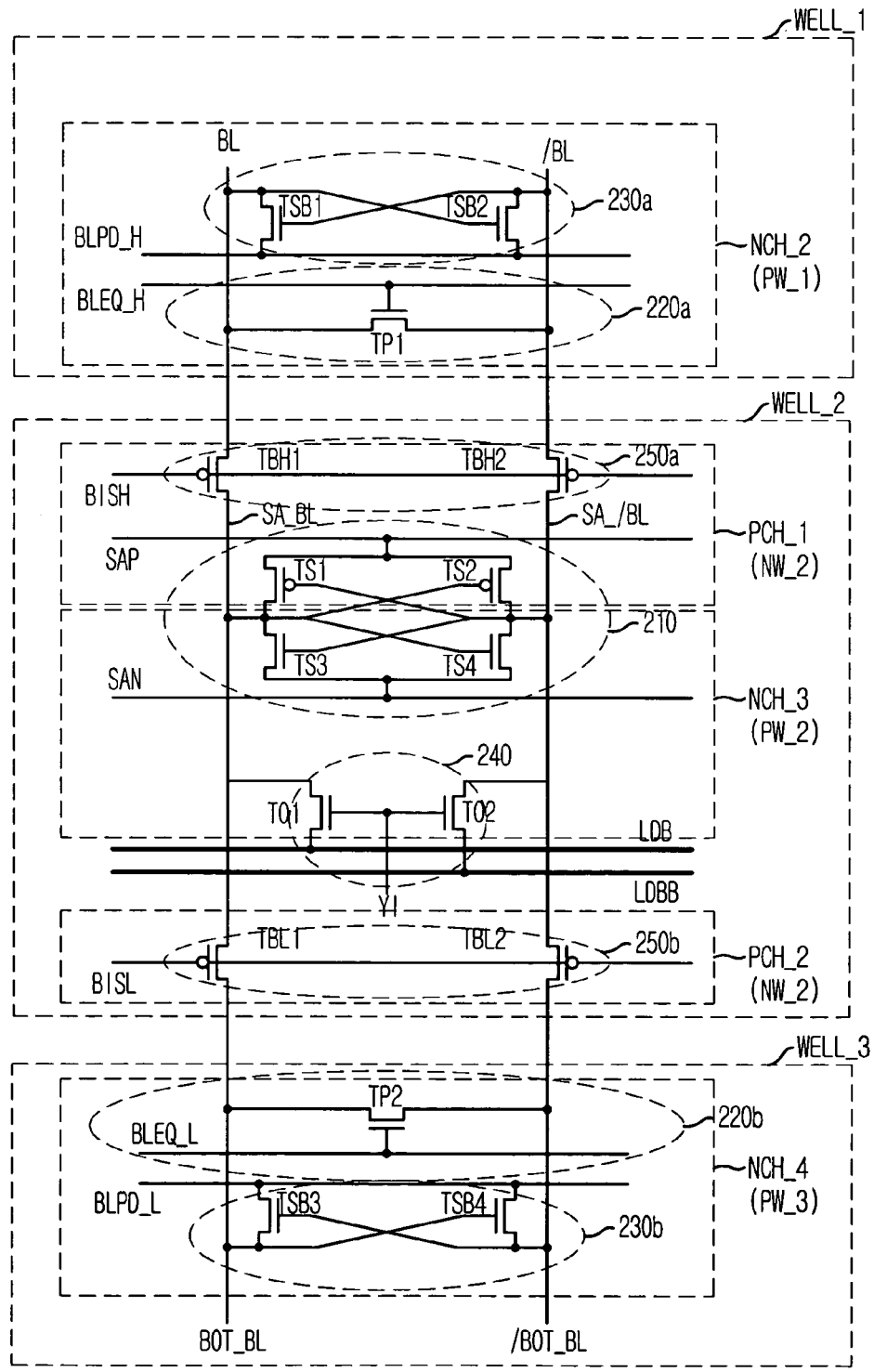
FIG. 10 is a layout showing the bit line sense amplifying block of the semiconductor memory device shown in FIG. 8.
Figure 11:
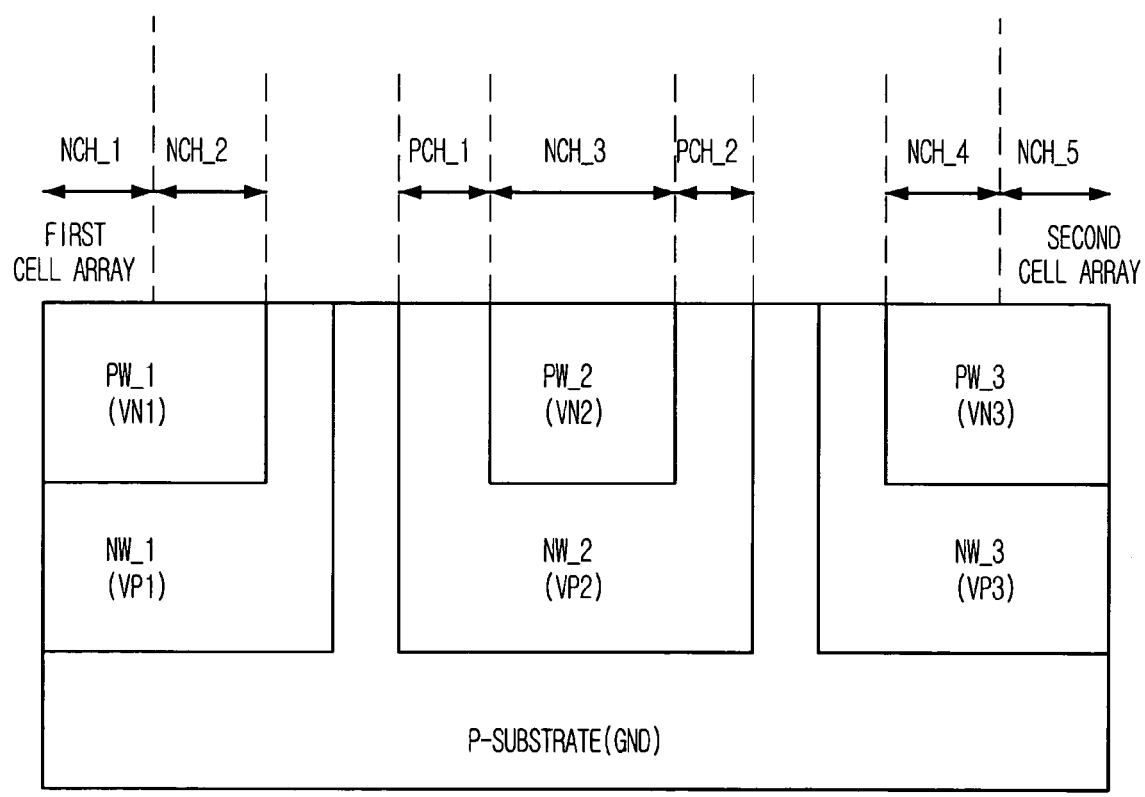
FIG. 11 is cross-sectional view describing the layout of the bit line sense amplifying block shown in FIG. 10.

FIG. 10 is a layout showing the bit line sense amplifying block 200 of the semiconductor memory device shown in FIG. 8. FIG. 11 is cross-sectional view describing the layout of the bit line sense amplifying block 200 shown in FIG. 10.

Hereinafter, the layout of the semiconductor memory device can be implemented as shown in FIGS. 10 and 11.

As shown, the semiconductor memory device in accordance with the present invention has a folded bit line structure and operates by receiving a source voltage VDD and a ground voltage GND.

Referring to FIG. 10, the semiconductor memory device includes a first P-well PW_1, a second P-well PW_2 and, a second N-well NW_2.

The first P-well PW_1 includes a first cell array and a first precharge NMOS transistor TP1. The first cell array stores data and outputs the data to one of the first bit line BL and the first bit line bar /BL selected among the plurality of bit lines provided in the plurality of unit cells. The first precharge NMOS transistor TP1 having an N-channel equalizes voltage levels of the first bit line pair BL and /BL in the first cell array during a precharge step.

The second N-well NW_2 includes first and second sense amplifying PMOS transistors TS1 and TS2, and first and second connection PMOS transistors TBH1 and TBH2. The first and the second sense amplifying PMOS transistors TS1 and TS2 having a P-channel, among a plurality of sense amplifying MOS transistors, senses and amplifies a signal difference between the first bit line BL and the first bit line bar /BL. The first and the second connection PMOS transistors TBH1 and TBH2 having a P-channel connects or disconnects the first bit line pair BL and /BL from/to the first and the second sense amplifying PMOS transistors TS1 and TS2.

The second P-well PW_2 includes first and second sense amplifying NMOS transistors TS3 and TS4 have an N-channel among the plurality of sense amplifying MOS transistors for sensing and amplifying the signal difference between the first bit line pair BL and /BL.

In accordance with the preferred embodiment of the present invention, the semiconductor memory device floats the first bit line pair BL and /BL by not proving a special precharge voltage to the first bit line pair BL and /BL during the precharge step.

In addition, in the preferred embodiment of the present invention, the first and the second sense amplifying PMOS transistors TS1 and TS2 having the P-channel perform a sensing and amplifying operation by using the low voltage VBB having the lower voltage level than the ground voltage GND, and the first and the second sense amplifying NMOS transistors TS3 and TS4 having the N-channel perform a sensing and amplifying operation by using the source voltage VDD or a high voltage VPP having the higher voltage level than the source voltage VDD.

The first P-well PW_1 further includes first and second auxiliary MOS transistors TSB1 and TSB2 having an N-channel for sensing and amplifying a lower voltage level of the first bit line pair BL and /BL, which is located between the first cell array and the first and the second connection PMOS transistors TBH1 and TBH2, as the voltage level of the ground voltage GND.

The semiconductor memory device in accordance with the present invention further includes a third P-well PW_3. The third P-well PW_3 includes a second cell array and a second precharge NMOS transistor TP2. The second cell array stores data and outputs the data to one of the second bit line BOT_BL and the second bit line bar /BOT_BL selected among a plurality of bit lines provided in the plurality of unit cells. The second precharge NMOS transistor TP2 having an N-channel equalizes voltage levels of the second bit line pair BOT_BL and /BOT_BL in the second cell array during the precharge step.

The second N-well NW_2 further includes third and fourth connection PMOS transistors TBL1 and TBL2 having a P-channel for connecting or disconnecting the second bit line pair BOT_BL and /BOT_BL to the first and the second sense amplifying PMOS transistors TS1 and TS2, and the first and the second sense amplifying NMOS transistors TS3 and TS4.

As described above, the second N-well NW_2 includes the first to the fourth connection PMOS transistors TBH1, TBH2, TBL1 and TBL2, and the first and the second sense amplifying PMOS transistors TS1 and TS2. The second P-well PW_2 includes the first and the second sense amplifying NMOS transistors TS3 and TS4. Accordingly, the second P-well PW_2 is wrapped up in the second N-well NW_2 as shown in FIG. 11.

Hereinafter, the third P-well PW_3 further includes third and fourth auxiliary NMOS transistors TSB3 and TSB4 having an N-channel for sensing and amplifying a lower voltage level of the second bit line pair BOT_BL and /BOT_BL, which is located between the second cell array and the third and the fourth connection PMOS transistors TBL1 and TBL2, as the voltage level of the ground voltage GND.

In addition, the second P-well PW_2 further includes first and second input/output NMOS transistors T01 and T02 having an N-channel for connecting the data sensed and amplified by the plural sense amplifying MOS transistors TS1 to TS4 to a local data bus line pair LDB and LDBB.

Each of the first to the third P-well PW_1 to PW_3 and the second N-well NW_2 is formed over a P-type substrate. The P-type substrate further includes a first N-well NW_1 and a third N-well NW_3. Herein, the first P-well PW_1 is wrapped up in the first N-well NW_1 and the third P-well PW_3 is wrapped up in the third N-well NW_3 as shown in FIG. 11.

Meanwhile, each of the N-wells and the P-wells can be formed over the P-type substrate, opposite to each other. In this case, each MOS transistor included in the N-wells and the P-wells has an opposite polarity channel.

As described above, the semiconductor memory device floats the corresponding bit line pair during the precharge step and the bit line sense amplifier senses and amplifies the voltage difference between the bit line pair using the low voltage and the source voltage.

Since each of the first and the second connection unit includes plural PMOS transistors, even though the bit line sense amplifier senses and amplifies the voltage difference using the low voltage and the source voltage, the low voltage VBB is not transferred to the cell array. At the same time, the semiconductor memory device further includes the first and the second auxiliary bit line sense amplifier so that the bit line coupled to the cell array is not to be under the ground voltage.

As shown in FIG. 11, each of the first to the third N-wells NW_1 to NW_3 is supplies with first to third positive voltage VP1, VP2 and VP3, and each of the first to the third P-wells PW_1 to PW_3 is supplies with first to third negative voltage VN1, VN2 and VN3.

Generally, as an operating voltage of the semiconductor memory device is smaller, an operating margin of each threshold voltage of PMOS and NMOS transistors included in the semiconductor memory device is not sufficient; and, as a result, an operation reliability of the bit line sense amplifier is not guaranteed.

Herein, an absolute quantity of each threshold voltage of the PMOS and the NMOS transistors is increased in proportion to a voltage level supplied to each of the N-wells and the P-wells. That is, in case of an NMOS transistor having an N-channel, as the absolute quantity of a voltage level of a negative voltage, i.e., VN1 to VN3, supplied to the P-well is increased, a threshold voltage of the NMOS transistor is increased. Likewise, in case of a PMOS transistor having a P-channel, as the absolute quantity of a voltage level of a positive voltage, i.e., VP1 to VP3, supplied to the N-well is increased, a threshold voltage of the PMOS transistor is increased.

Accordingly, even though each of the NMOS and the PMOS transistor has a same size, each threshold voltage of the NMOS and the PMOS transistor is different according to the voltage level supplied to each of the N-wells and the P-wells. As a result, a current driving ability of each MOS transistor included in the corresponding well depends on a bulk voltage supplied to each well. In addition, under a low supply voltage condition, since the operating margin of each threshold voltage of PMOS and NMOS transistors included in the semiconductor memory device is not sufficient, a variation of the threshold voltage has influence on the operation reliability.

In the semiconductor memory device, an operation reliability of the bit line sense amplifier has a great influence on a circuit driving ability. Specially, the bit line sense amplifier is sensitive to the low supply voltage because the bit line sense amplifier stars to amplify a sensed voltage at the precharge voltage of the bit line pair, e.g., a half of the source voltage VDD.

In accordance with the present invention, each bulk voltage can be supplied to a corresponding well area by separating a well area for forming the bit line sense amplifier from a well area for forming the cell array.

When the cell array includes a plurality of unit cells having an NMOS transistor and a cell capacitor, it is important to arrange the PMOS transistor of the bit line sense amplifier, which operates by using a negative low voltage and connects the bit line sense amplifier to the cell array.

Accordingly, in accordance with the present invention referring to FIG. 10, the semiconductor memory device largely defines three well areas to thereby supply an optimum bulk voltage to each well area: a first well area WELL_1 includes the first cell array and the first precharge unit 220a; a second well area WELL_2 includes the bit line sense amplifier 210 and the first and the second connection unit 250a and 250b; and a third well area WELL_3 includes the second cell array and the second precharge unit 220b.

In addition, the second well area WELL_2 further defines two well area, i.e., the second P-well PW_2 and the second N-well NW_2, to thereby arrange the first and the second sense amplifying PMOS transistors TS1 and TS2 to the second N-well NW_2, and the first and the second sense amplifying NMOS transistors TS3 and TS4 to the second P-well PW_2. At the same time, the first to the fourth connection PMOS transistors TBH1, TBH2, TBL1 and TBL2 are formed at the second N-well NW_2 where the first and the second sense amplifying PMOS transistors TS1 and TS2 is located. Accordingly, the second P-well PW_2 is wrapped up in the second N-well NW_2 as shown in FIG. 11. Further, it is possible to effectively connect the first and the second cell array with the bit line sense amplifier 210 included in the first and the third well areas WELL_1 and WELL_3.

As described above, the PMOS and the NMOS transistors provided in the semiconductor memory device can be effectively arranged so that the optimum bulk voltage is supplied to the PMOS and the NMOS transistors to thereby get an optimum threshold voltage of each PMOS and each NMOS transistor.

Effective advantages of the semiconductor memory device in accordance with the present invention are described below.

Firstly, since a particular precharge voltage is not needed to be supplied at a precharge step, a power consumption at the precharge step can be reduced. That is, according to the conventional invention, since a source voltage or a half of a supply voltage VDD is provided for the precharge step, a predetermined amount of power is consumed. However, since the semiconductor memory device in accordance with the present invention does not need an additional power for the precharge step, the power consumption can be dramatically reduced.

Secondly, a bleed current caused by a short-circuit between a word line and a bit line of a unit cell can be prevented. As above-mentioned, since the bleed current is still generated after the word line is replaced with a redundancy word line, a power is unnecessarily consumed. However, in accordance with the present invention, there is no particular precharge voltage for the bit line and the bit line is floated. Therefore, the bit line has a voltage level of a ground voltage GND and, thus, the bleed current can be prevented because there is no voltage difference between the word line and the bit line. Herein, at an initial state of the precharge step, since the bit line has a predetermined voltage level, a little bleed current may be generated; however, the bleed current is not generated after a voltage level of the floated bit line becomes the ground voltage GND.

Thirdly, since a bit line sense amplifier performs a sensing and amplifying operation by using the source voltage VDD and a low voltage VBB which is lower than the ground voltage GND, a data signal delivered to the bit line can sensed and amplified by the bit line sense amplifier at a high speed even though the source voltage VDD is low. Also, an absolute quantity of the low voltage VBB may be same to that of the source voltage VDD as an operational voltage of the semiconductor memory device is decreased. In this case, a half of the source voltage VDD becomes the ground voltage GND. Accordingly, the bit line sense amplifier amplifies a high-level data to the source voltage VDD and a low-level data to the low voltage VBB and, then, at the precharge step, a voltage level of the bit line pair is maintained as the ground voltage GND.

Fourthly, according to the conventional invention, since the precharge voltage level is a source voltage VDD or a half of the source voltage VDD, a current is flown from a data line to a bit line and, thus, a voltage level of a bit line amplified to a low level is temporarily increased. However, in accordance with the present invention, since the bit line sense amplifier amplifies a voltage level of a bit line to a negative low voltage, the current flown from the data line is compensated by the negative low voltage. Therefore, a voltage level of the bit line is not increased more than the ground voltage. As a result, a period of the restore step can be decreased and a cycle time also can be decreased.

Lastly, since the semiconductor memory device is operated by using a low voltage restraining using a high voltage, a power consumption for generating the high voltage can be reduced. That is, an absolute quantity of the low voltage is smaller than that of the high voltage and characteristics of the low voltage is better than that of the high voltage.

As a result, in accordance with the present invention, the semiconductor memory device can perform a data access operation at a high speed under a low operational voltage. In addition, in case of a semiconductor memory device having a folded bit line structure with a shared bit line structure, it is possible to get an optimum threshold voltage of each PMOS and each NMOS transistor provided in the semiconductor memory device by forming each cell array and a bit line sense amplifier using a separate well area.

The present application contains subject matter related to Korean patent application No. 2005-27382, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a folded bit line structure and operating with a source voltage and a ground voltage, comprising:
   a first first-type well including a first cell array for providing data to a first bit line or a first bit line bar selected among a plurality of bit lines, and a first precharge MOS transistor having a second-type channel for equalizing voltage levels of the first bit line and the first bit line bar during a precharge period;

a first second-type well including a first sense amplifying MOS transistor having a first-type channel among a plurality of sense amplifying MOS transistors for sensing and amplifying a signal difference between the first bit line and the first bit line bar, and a first connection MOS transistor having a first-type channel for connecting or disconnecting the first bit line and the first bit line bar to or from the first sense amplifying MOS transistor; and a second first-type well including a second sense amplifying MOS transistor having a second-type channel among the plurality of sense amplifying MOS transistors for sensing and amplifying the signal difference between the first bit line and the first bit line bar.

2. The semiconductor memory device as recited in claim 1, wherein the first bit line and the first bit line bar are floated during the precharge period.

3. The semiconductor memory device as recited in claim 2, wherein the second sense amplifying MOS transistor performs a sensing and amplifying operation by using a low voltage lower than the ground voltage.

4. The semiconductor memory device as recited in claim 3, wherein the first sense amplifying MOS transistor performs a sensing and amplifying operation by using a high voltage higher than the source voltage.

5. The semiconductor memory device as recited in claim 3, wherein the first sense amplifying MOS transistor performs a sensing and amplifying operation by using the source voltage.

6. The semiconductor memory device as recited in claim 2, wherein the first first-type well includes a first auxiliary MOS transistor having a second-type channel for sensing and amplifying a lower voltage level of the first bit line and the first bit line bar, which are located between the first cell array and the first connection MOS transistor, as a voltage level of the ground voltage.

7. The semiconductor memory device as recited in claim 6, further comprising a third first-type well including a second cell array for storing data to be applied to one of a second bit line and a second bit line bar selected among the plurality of bit lines, and a second precharge MOS transistor having a second-type channel for equalizing voltage levels of the second bit line and the second bit line bar during the precharge period.

8. The semiconductor memory device as recited in claim 7, wherein the first second-type well includes a second connection MOS transistor having a first-type channel for connecting or disconnecting the second bit line and the second bit line bar to or from the first and the second sense amplifying MOS transistors.

9. The semiconductor memory device as recited in claim 8, wherein the third first-type well includes a second auxiliary MOS transistor having a second-type channel for sensing and amplifying a lower voltage level of the second bit line and the second bit line bar, which are located between the second cell array and the second connection MOS transistor, as the voltage level of the ground voltage.

10. The semiconductor memory device as recited in claim 9, wherein the second first-type well includes an input/output MOS transistor having a second-type channel for connecting the data sensed and amplified by the first and the second sense amplifying MOS transistors to a local data bus line.

11. The semiconductor memory device as recited in claim 10, wherein the first to third first-type wells, and the first second-type well are formed over a first-type substrate.

12. The semiconductor memory device as recited in claim 11, wherein the first-type substrate includes a second second-type well for wrapping up the first first-type well and a third second-type well for wrapping up the third first-type well.

13. The semiconductor memory device as recited in claim 12, wherein each of the first to the third first-type wells, and the first and the second second-type wells is supplied with a different bulk voltage.

14. The semiconductor memory device as recited in claim 12, wherein the first-type is a P-type and the second-type is an N-type.

15. The semiconductor memory device as recited in claim 12, wherein the first-type is an N-type and the second-type is a P-type.

16. A semiconductor memory device having a folded bit line structure and operating with a source voltage and a ground voltage, comprising:

a first well including a first cell array for providing data to a first bit line or a first bit line bar selected among a plurality of bit lines;

a second well including a second cell array for providing data to a second bit line or a second bit line bar selected among the plurality of bit lines;

a third well including a first sense amplifying MOS transistor having a first-type channel among a plurality of sense amplifying MOS transistors provided in a bit line sense amplifier, a first connection unit for connecting or disconnecting the first bit line and the first bit line bar to or from the bit line sense amplifier, and a second connection unit for connecting or disconnecting the second bit line and the second bit line bar to or from the bit line sense amplifier; and a fourth well including a second sense amplifying MOS transistor having a second-type channel among the plurality of sense amplifying MOS transistors provided in the bit line sense amplifier.

17. The semiconductor memory device as recited in claim 16, wherein the first well includes a first precharge unit for equalizing voltage levels of the first bit line and the first bit line bar during a precharge period.

18. The semiconductor memory device as recited in claim 17, wherein the second well includes a second precharge unit for equalizing voltage levels of the second bit line and the second bit line bar during the precharge period.

19. The semiconductor memory device as recited in claim 18, wherein the first and the second precharge units float the first and the second bit lines and the first and the second bit line bars during the precharge period.

20. The semiconductor memory device as recited in claim 19, wherein the second sense amplifying MOS transistor performs a sensing and amplifying operation by using a low voltage lower than the ground voltage.

21. The semiconductor memory device as recited in claim 19, wherein the first sense amplifying MOS transistor performs a sensing and amplifying operation by using a high voltage higher than the source voltage.

22. The semiconductor memory device as recited in claim 19, wherein the first sense amplifying MOS transistor performs a sensing and amplifying operation by using the source voltage.

23. The semiconductor memory device as recited in claim 19, wherein the first well includes a first auxiliary unit for sensing and amplifying a lower voltage level of the first bit line and the first bit line bar, which are located between the first cell array and the first connection unit, as a voltage level of the ground voltage.

24. The semiconductor memory device as recited in claim 19, wherein the second well includes a second auxiliary unit for sensing and amplifying a lower voltage level of the second bit line and the second bit line bar, which are located between the second cell array and the second connection unit, as a voltage level of the ground voltage.

25. The semiconductor memory device as recited in claim 19, wherein the fourth well includes a data input/output unit for outputting data sensed and amplified by the bit line sense amplifier through a local data bus line to an external circuit, or for delivering data inputted from the external circuit via the local data bus line to the bit line sense amplifier.

26. The semiconductor memory device as recited in claim 19, wherein the first to the fourth wells are formed over a first-type substrate.

27. The semiconductor memory device as recited in claim 26, wherein the fourth well is wrapped up in the third well.

28. The semiconductor memory device as recited in claim 26, wherein each of the first to the fourth wells is supplied with a different bulk voltage.

29. The semiconductor memory device as recited in claim 26, wherein the first-type is a P-type and the second-type is an N-type.

30. The semiconductor memory device as recited in claim 26, wherein the first-type is an N-type and the second-type is a P-type.

* * * * *